United States Patent
Yang

(10) Patent No.: US 6,701,491 B1
(45) Date of Patent: Mar. 2, 2004

(54) INPUT/OUTPUT PROBING APPARATUS AND INPUT/OUTPUT PROBING METHOD USING THE SAME, AND MIXED EMULATION/SIMULATION METHOD BASED ON IT

(76) Inventor: Sei-Yang Yang, 101-2108 Shindonga Apt., Kuseo-dong, Keumjeong-ku, 609-310 Pusan (KR)

( * ) Notice: Subject to any disclaimer, the term of this patent is extended or adjusted under 35 U.S.C. 154(b) by 0 days.

(21) Appl. No.: 10/019,374
(22) PCT Filed: Jun. 26, 2000
(86) PCT No.: PCT/KR00/00670
§ 371 (c)(1), (2), (4) Date: Mar. 26, 2002
(87) PCT Pub. No.: WO01/01245
PCT Pub. Date: Jan. 4, 2001

(30) Foreign Application Priority Data

Jun. 26, 1999 (KR) .......................................... 1999-26206
Mar. 6, 2000 (KR) .......................................... 2000-11646

(51) Int. Cl.[7] .............................................. G06F 17/50
(52) U.S. Cl. .................................... 716/4; 716/5; 716/6
(58) Field of Search ............... 716/4–6, 16; 703/13–15, 703/19; 714/724, 725, 738; 326/39, 41

(56) References Cited

U.S. PATENT DOCUMENTS

| | | | |
|---|---|---|---|
| 5,604,888 A | * | 2/1997 | Kiani-Shabestari et al. ... 703/23 |
| 6,026,230 A | * | 2/2000 | Lin et al. ....................... 703/13 |
| 6,058,492 A | * | 5/2000 | Sample et al. ................. 714/33 |

FOREIGN PATENT DOCUMENTS

| | | |
|---|---|---|
| JP | 10-027112 | 1/1998 |
| JP | 11-184724 | 7/1999 |

OTHER PUBLICATIONS

Agrawal, "Mixed Behavior–Logic Simulation in a Hardware Accelerator", IEEE Pub., pp. 9.2.1–9.2.4, 1990.*
Brown et al., "Issues in the Design of a Logic Simulator: Element Modelling for Efficiency", IEEE Pub., pp. 21–27, Feb. 1996.*
Kenyon, P.; Agrawal, P.; Seth, S., "High–Level microprogramming: an optimizing C compiler for a processing element of a CAD accelerator", IEEE Pub., pp. 97–106, Nov. 1990.*
Varghese et al., "An Efficient Logic Emulation System", IEEE Publication, pp. 171–174, 1993.*
Gab Youn Kang, PTC International Search Report, Nov. 28, 2000, 3 pages, Korean Industrial Property Office, Metropolitan City, Republic of Korea.
Gab Youn Kang, PTC International Preliminary Examination Report, Nov. 28, 2000, 3 pages, Korean Industrial Property Office, Metropolitan City, Republic of Korea.

* cited by examiner

Primary Examiner—Vuthe Siek
Assistant Examiner—Naum Levin
(74) Attorney, Agent, or Firm—Senniger, Powers, Leavitt & Roedel

(57) ABSTRACT

An interactive environment is provided for integrated circuit (IC) designers to do an emulation session on a hardware accelerator 111 and then move to simulator 131, and vice versa. An aspect of the present inventive solution swaps memory state and logic storage node state (such as flip-flops and latches) between the accelerator 111 and simulator 131. A complete context switch is performed to create a time shared environment on hardware accelerator 111 so that multiple IC designers can access and use the accelerator. Multiple memory pages can be incorporated to minimize state swap time. Multiple accelerators 111 can be interconnected with a plurality of simulators 131 and a plurality of workstations 101 to allow multiple designers to do interactive operations and allows shifting back and forth between hardware emulation and software simulation.

25 Claims, 15 Drawing Sheets

FIG. 7abc
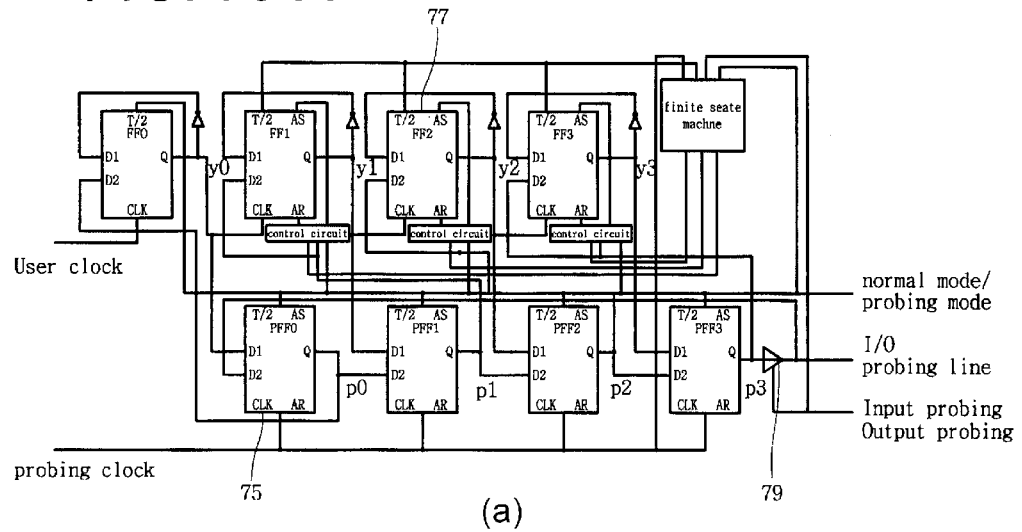
(a)
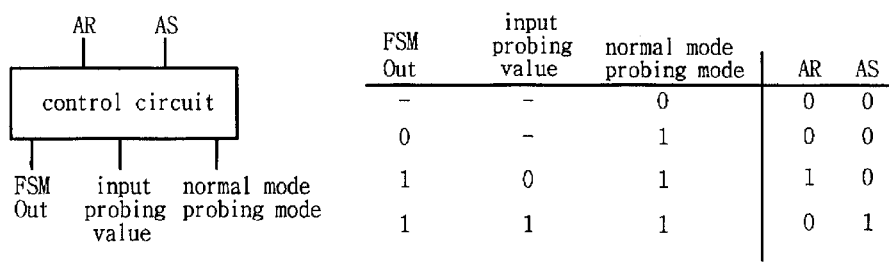
| FSM Out | input probing value | normal mode probing mode | AR | AS |
|---|---|---|---|---|
| – | – | 0 | 0 | 0 |
| 0 | – | 1 | 0 | 0 |
| 1 | 0 | 1 | 1 | 0 |
| 1 | 1 | 1 | 0 | 1 |
(b)
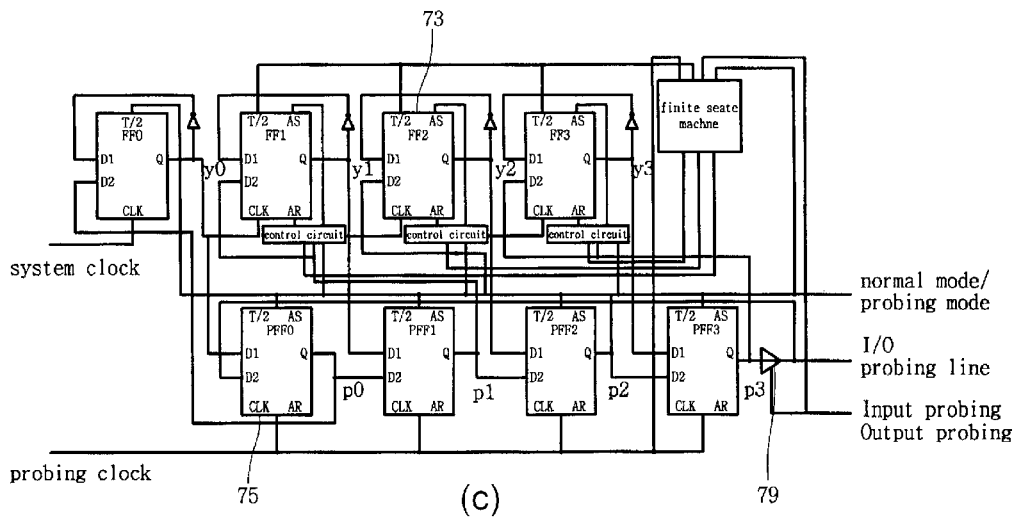
(c)

FIG. 7def
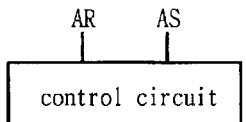
| FSM Out | input probing value | normal mode probing mode | AR | AS |
|---|---|---|---|---|
| – | – | 0 | 0 | 0 |
| 0 | – | 1 | 0 | 0 |
| 1 | 0 | 1 | 1 | 0 |
| 1 | 1 | 1 | 0 | 1 |
(d)
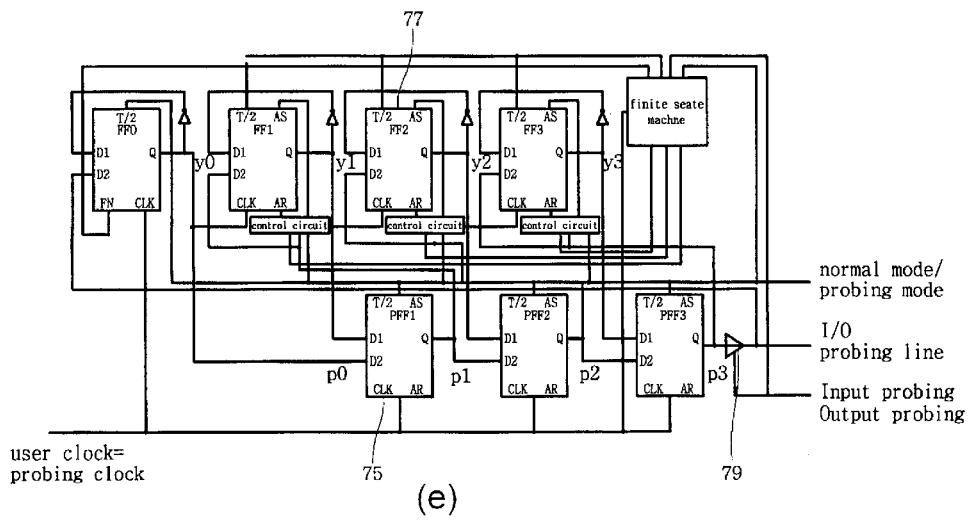
(e)
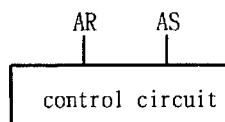
| FSM Out | input probing value | normal mode probing mode | AR | AS |
|---|---|---|---|---|
| – | – | 0 | 0 | 0 |
| 0 | – | 1 | 0 | 0 |
| 1 | 0 | 1 | 1 | 0 |
| 1 | 1 | 1 | 0 | 1 |
(f)

FIG. 7gh
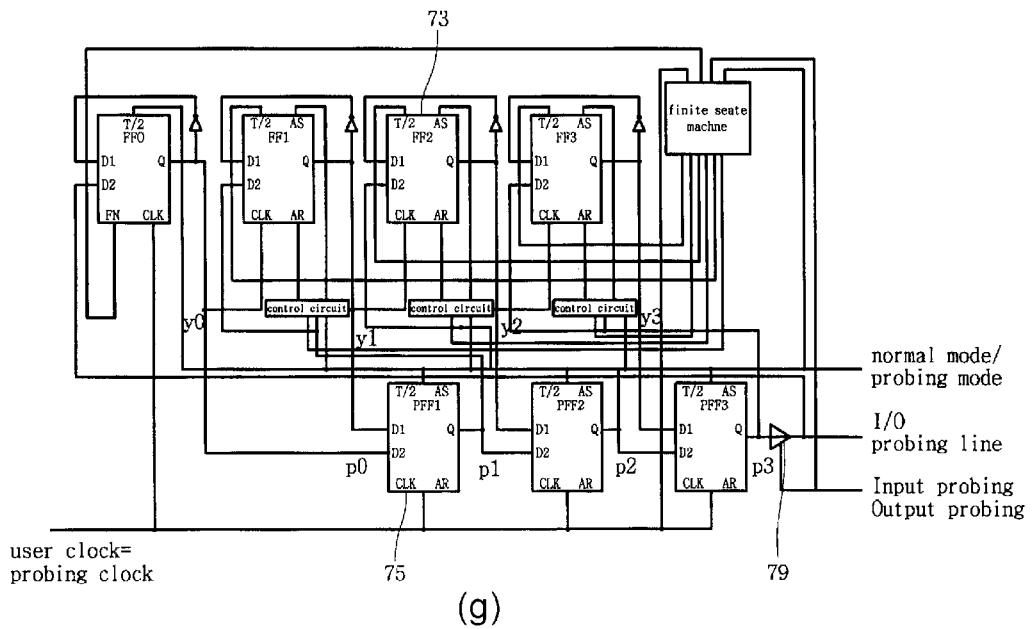
(g)
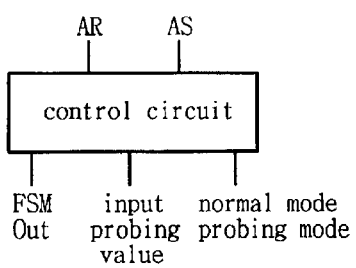
| FSM Out | input probing value | normal mode probing mode | AR | AS |
|---|---|---|---|---|
| – | – | 0 | 0 | 0 |
| 0 | – | 1 | 0 | 0 |
| 1 | 0 | 1 | 1 | 0 |
| 1 | 1 | 1 | 0 | 1 |
(h)

FIG. 8abc
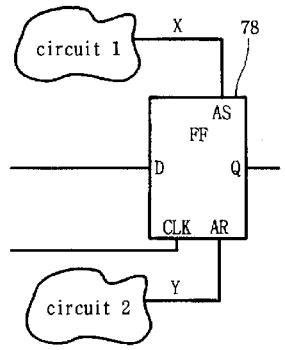
(a)
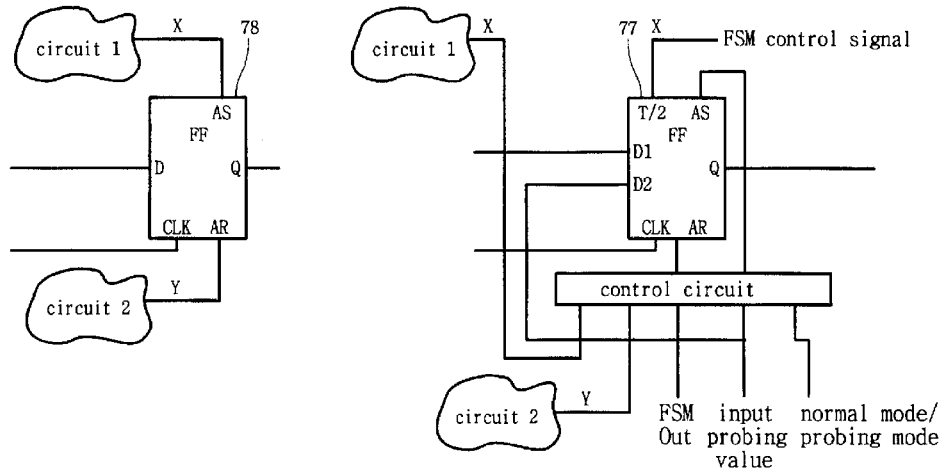
(b)
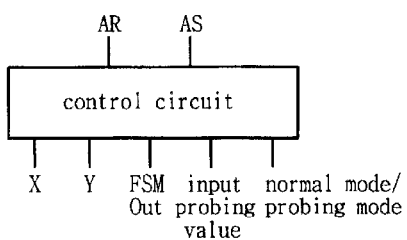
| X | Y | FSM Out | input probing value | normal mode/ probing mode | AR | AS |
|---|---|---------|---------------------|---------------------------|----|----|
| 0 | 0 | -       | -                   | 0                         | 0  | 0  |
| 1 | 0 | -       | -                   | 0                         | 0  | 1  |
| 0 | 1 | -       | -                   | 0                         | 1  | 0  |
| 1 | 1 | -       | -                   | 0                         | 0  | 0  |
| - | - | 0       | -                   | 1                         | 0  | 0  |
| - | - | 1       | 0                   | 1                         | 1  | 0  |
| - | - | 1       | 1                   | 1                         | 0  | 1  |
(c)

FIG. 8def
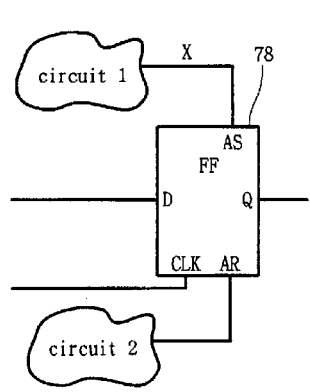
(d)
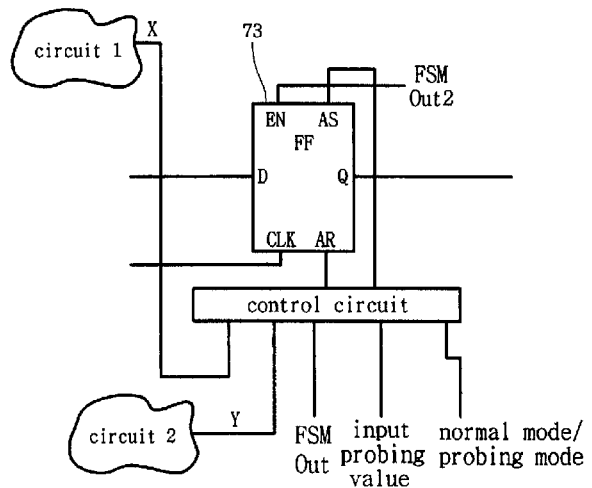
(e)
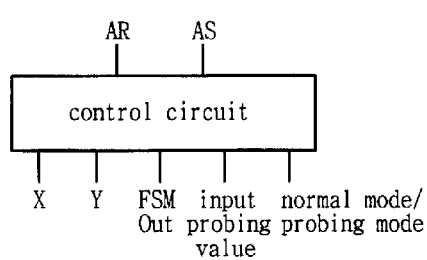
| X | Y | FSM Out | input probing value | normal mode/ probing mode | AR | AS |
|---|---|---|---|---|---|---|
| 0 | 0 | – | – | 0 | 0 | 0 |
| 1 | 0 | – | – | 0 | 0 | 1 |
| 0 | 1 | – | – | 0 | 1 | 0 |
| 1 | 1 | – | – | 0 | 0 | 0 |
| – | – | 0 | – | 1 | 0 | 0 |
| – | – | 1 | 0 | 1 | 1 | 0 |
| – | – | 1 | 1 | 1 | 0 | 1 |
(f)

FIG. 9
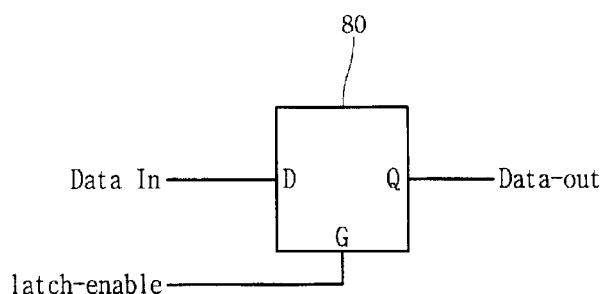
(a)
| G | D | Q |
|---|---|---|
| 1 | 0 | 0 |
| 1 | 1 | 1 |
| 0 | – | unchanged |
(b)
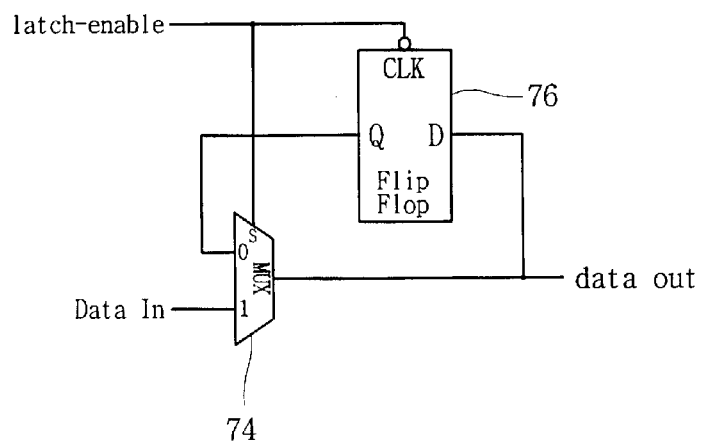
(c)

INPUT/OUTPUT PROBING APPARATUS AND INPUT/OUTPUT PROBING METHOD USING THE SAME, AND MIXED EMULATION/ SIMULATION METHOD BASED ON IT

BACKGROUND OF THE INVENTION

1. Field of the Invention

The present invention relates to a technique for verifying and inspecting a designed digital circuit, and more particularly to an input/output probing apparatus which is capable of implementing a designed digital circuit as a programmable chip or as an order-built type semiconductor chip actually by hardware and capable of quickly verifying and inspecting it on an emulation basis, and a method using the same. Further, the present invention relates to a mixed emulation/simulation method which is capable of implementing a designed digital circuit as a programmable chip or as an ASIC semiconductor chip actually by hardware, capable of automatically switching from emulation to simulation executed by means of a simulator on a computer during emulating process, or reversely, capable of automatically switching from simulation executed on the computer by the simulator to emulation, thereby performing emulation and simulation in turn more than one time for verification and a mixed emulation/simulation verifying apparatus therefor.

2. Description of the Related Art

Recently, as a design for an integrated circuit and a semiconductor process technique are being rapidly developed, a design of a digital circuit tends to be enlarged and its construction becomes complicate. Accordingly, as competition in the market turns keen more and more, a method for verifying a designed circuit quickly and effectively is sought to meet the necessity.

Up to now, generally, a simulator, an approach based on software, has been employed to verify a designed digital circuit. Thanks to its advantage of using various delay models for a circuit, the simulation-based verifying method using the simulator allows a timing verification as well as a functional verification, and above all, it provides a perfect visibility for every signal line existing in a circuit during debugging.

However, as for the simulator, since a software code consisting of sequential instruction sequences, which is obtained by modeling the design verification circuit by software, is to be sequentially performed on computer, time for verification is taken for a long time, with a limitation that it fails to be integrated with a peripheral hardware environment for In-Circuit Emulation (referred to as an ICE, hereinafter).

Moreover, referring to the verification through simulation, since performance of a computer dependent on a simulation software and a single processor fails to come up with the complexity of a digital circuit of tens of thousands of gates which are rapidly increased, recently, it incurs an extremely long time to perform a simulation for a general design verification.

Comparatively, a hardware emulation based design verification method, that actually implements a designed circuit as a chip to use it, is advantageous in that since the digital circuit is verified while being parallely operated, design verification can be possibly carried out at a million time speed at the maximum compared to that of the simulation, and ICE environment is possibly constructed with respect to a peripheral hardware environment for integrated verification.

However, the emulation is not good for debugging compared to the simulation. The reason for this is that the visibility showing logic values of numerous signal lines existing in the circuit implemented with programmable chips or ASIC chips is exorbitantly degraded compared to simulation.

As a core device for emulation-based design verification, reusable field programmable devices (referred to as 'RFPD', hereinafter), that is, programmable chips, are employed. The RFPD includes a field programmable gate array and a complex programmable logic device. These days, with development of a semiconductor technique, the RFPD is highly integrated, making it possible to use a single RFPD or a very few RFPD for complex digital circuits and prototype it.

Unlike the implementation of a circuit using the ASIC chip, in case that a circuit is implemented by using the RFPD, it is advantageous in that it can be carried out in the field at a low cost, and time and expense are considerably reduced to correct a bug as being found.

The feature of the present invention also can be applied to a case of using an ASIC chip using a technique such as a standard cell or to a gate array in the same manner as well as the case of using the RFPD for implementation of the design verification circuit, but in the description of the present invention, using of the RFPD is taken for explanation's convenience.

As mentioned above, though prototyping can be economically performed owing to the development in the highly integrated semiconductor technique, since the numerous signal lines on the digital circuit, the target for design verification in prototyping, mostly exist inside the RFPD, it is difficult to probe the signal lines, degrading visibility for debugging. This problem would be more serious in the future when more highly integrated RFPD is expected to be used.

In order to solve the problem, a method is required for performing an effective and rapid probing even in the case that the signal lines of the circuit exist inside the chip, so that a circuit subjected to design verification as being implemented in the RFPD can be effectively and rapidly debugged.

Besides, in order to maximize the efficiency for design verification of a digital circuit, a method of mixedly using emulation and simulation appropriately in turn during design verifying process is required.

That is, a high speed function verification is carried out to the point of time when and in a specific situation where a very fine identification is required on the emulation basis for design verification. Thereafter, the verifying method is automatically switched from an emulation basis to a simulation basis to perform a functional verification or a timing verification with a 100%-perfect visibility for the target circuit of verification.

In this respect, switching between emulation and simulation is repeated more than one time, as necessary, to thereby maximize efficiency of the verification.

However, to date, in case that a hardware board (referred to as 'arbitrary prototyping board', hereinafter) on which a digital circuit is implemented with the RFPD, the programmable chip, or with a general ASIC semiconductor chip, is subjected to a design verification on the emulation basis, no input/output probing apparatus using an open architecture that can perform debugging rapidly and effectively even for a hardware board, not limiting to a specific hardware board, and no input/output probing method has been presented.

And, a general tendency shows that designers design a digital circuit by using a gated clock or a locally generated clock, rather than designing a fully synchronous circuit, to reduce a power consumption or due to various reasons.

However, such asynchronous factors make input/output probing for a circuit, especially, an input probing, very difficult. In addition, no input/output probing method has been proposed to cope with such a general situation.

Moreover, there has not been proposed any method and apparatus for mixedly using emulation and simulation for verification to thereby remove the shortcomings of the emulation-based verification method, in a manner of employing the hardware board on which an arbitrary ASIC semiconductor is mounted that implements a circuit subjected to a design verification including the asynchronous factors and an arbitrary simulator.

Especially, in case where simulation is first performed and emulation is subsequently performed, before emulation starts, memory devices and memories which exist in a circuit implemented in the RFPD that performs emulation are to have the same logic values as the logic values at the current time point of the memory devices (flipflops or latches) and the memories (RAM or ROM) of a design verification target circuit obtained by simulation.

However, in preparation for an asychronous situation in which a gated clock and a locally generated clock signal are applied to the clock input of the memory devices existing in the design verification target circuit, no method has been proposed to freely replace the logic values of memory devices existing in the circuit implemented in the RFPD with the specific logic values obtained by the result of simulation.

Furthermore, thanks to the recent development of the Internet technology, a general tendency is that a designer, a software for a design, a simulator, a hardware board for emulation, a server computer are dispersed and connected through network, rather than being collectively positioned in a place.

With such an environment in which the simulator and the hardware board are separately positioned at a distance, no method has been proposed to perform emulation and simulation in turn at a high speed in a time-shared system for a single design verification target circuit through a local area network or a remote area network.

In addition, the above described technique may be applied not only to a design verifying stage of a circuit but also to a testing stage after the circuit is completely fabricated.

A scan technique is one of the widely used technique to inspect the circuit. However, the scan fails to provide any controllable method for the memory devices using the gated clock or the locally generated clock as stated above.

The input/output probing method in accordance with the present invention basically provides a perfect controllability and an observability for any memory devices existing in a circuit, which, thus, is superior to the scan method in the aspect of circuit inspecting.

U.S. Pat. No. 5,937,179 filed by Texas Instrument (TI) discloses a method for performing emulation and simulation in turn. But it employs the above mentioned scan chain, that is, a general technique for circuit inspecting, which is not able to control a circuit if the circuit would include a memory device that would use the gated clock or the locally generated clock.

That is, it has problems that the mixed emulation/simulation is not available to circuits having an asynchronous factor, and it is designed to be adopted only for the completely synchronous circuit in which the same clocks are applied to the every memory device existing therein. Also, since it doesn't not have an open architecture, it is not possible to be applied to a hardware board.

SUMMARY OF THE INVENTION

Therefore, an object of the present invention is to provide a rapid input/output probing apparatus and input/output probing method using the same which are capable of enabling an input/output probing system controller to add a supplementary circuit to a design verification or inspection target circuit to thereby automatically generate an extended circuit suitable for input/output probing so as to be implemented in a semiconductor chip, thereby performing an effective design verification or inspection for a digital circuit.

Another object of the present invention is to provide an input/output probing method for mixedly performing emulation and simulation to perform input/output probing even for any prototyping board by means of an input/output probing apparatus, thereby rapidly and effectively debugging.

To achieve these and other advantages and in accordance with the purpose of the present invention, as embodied and broadly described herein, there is provided an input/output probing apparatus including an input/output probing system controller and an input/output probing interface module.

The input/output probing system controller of the present invention includes an input/output probing system software, and the input/output probing interface module may include an interface module and an interface cable.

The input/output probing system controller is executed in a server computer, and the server computer may includes a simulator or may be connected with a different computer having a simulator through a remote local area network.

The input/output interface module serves to connected the server computer having the input/output probing system controller with a prototyping board including at least one semiconductor chip (i.e., FPGA) for implementing a designed digital circuit.

Another primary function of the input/output probing interface module is to generate at least one system clock and probing clock required for input/output probing, an operating mode control signal, a probing mode control signal or a probing memory reading/writing signal under the control of the input/output probing system controller and to supply them to the prototyping board as necessary, thereby controlling performing and stopping of the prototyping board.

For this purpose, the input/output probing interface module includes a FPGA or CPLD, microprocessor or a microcontroller, or a special ASIC chip.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 7A is a schematic view showing a situation in which an IOP-probing supplementary circuit is added to a design verification target circuit of FIG. 5 in accordance with the present invention;

FIG. 7B is a schematic view showing a control circuit in use for the situation that the IOP-probing supplementary circuit has been added to the design verification target circuit of FIG. 5 and defining it with a truth table in accordance with the present invention;

FIG. 7C is a schematic view showing another situation in which an IOP-probing supplementary circuit is added to a design verification target circuit of FIG. 5 in accordance with the present invention;

FIG. 7D is a schematic view showing a control circuit in use for another situation that the IOP-probing supplementary circuit has been added to the design verification target circuit of FIG. 5 and defining it with a truth table in accordance with the present invention;

FIG. 7E is a schematic view showing still another situation in which an IOP-probing supplementary circuit is added to a design verification target circuit of FIG. 5 in accordance with the present invention;

FIG. 7F is a schematic view showing a control circuit in use for the still another situation that the IOP-probing supplementary circuit has been added to the design verification target circuit of FIG. 5 and defining it with a truth table in accordance with the present invention;

FIG. 7G is a schematic view showing yet another situation in which an IOP-probing supplementary circuit is added to a design verification target circuit of FIG. 5 in accordance with the present invention;

FIG. 7H is a schematic view showing a control circuit in use for the yet another situation that the IOP-probing supplementary circuit has been added to the design verification target circuit of FIG. 5 and defining it with a truth table in accordance with the present invention;

FIG. 8A is a schematic view showing a situation in which a flipflop of the design verification target circuit has an asynchronous set and an asynchronous reset in accordance with the present invention.

FIG. 8B is a schematic view showing a situation in which the flipflop of FIG. 8A is converted in an extended design verification target circuit in accordance with the present invention;

FIG. 8C is a view showing a truth table of the control circuit used in FIG. 8B in accordance with the present invention;

FIG. 8D is a schematic view showing a situation in which a flipflop of the design verification target circuit has an asynchronous set and an asynchronous reset in accordance with the present invention.

FIG. 8E is a schematic view showing a situation in which the flipflop of FIG. 8D is converted in an extended design verification target circuit in accordance with the present invention;

FIG. 8F is a view showing a truth table of the control circuit used in FIG. 8E in accordance with the present invention;

FIG. 9 is a view showing a construction of a circuit functionally equivalent to a latch with a flipflop and a multiplexer in accordance with the present invention;

DETAILED DESCRIPTION OF THE PREFERRED EMBODIMENT

A preferred embodiment of the present invention will be described below, with reference to the accompanying drawings.

Figure 1:
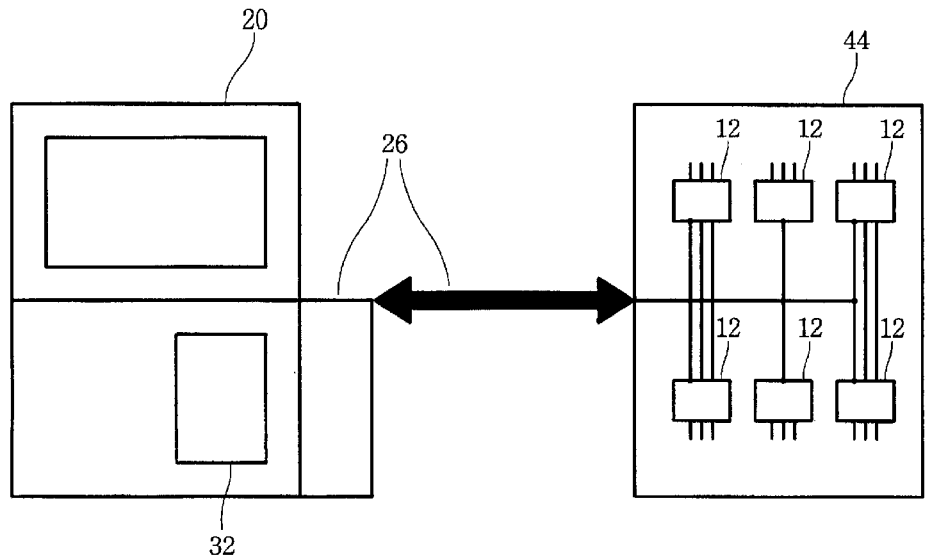
FIG. 1 is a schematic view of an input/output probing apparatus in accordance with the present invention.

FIG. 1 schematically shows a I/O (input/output) probing system consisting of a I/O probing system control unit operated under the control of a computer used as a server and a I/O probing interface module.

The I/O probing interface module 26 shown in FIG. 1 is typically mounted in a PCI (peripheral computer interface) slot to be connected to a PCI bus of the server computer 20 or a secondary system bus, such as S-bus of SUN workstation, similar to the PCI bus. However, in case of high speed applications, the module 26 may be connected to a main bus or primary system bus of the server computer. If a low speed operation is allowed, the connection of the module 26 may be implemented using a USB (Universal Serial Bus), etc. through which the server computer 20 and any of prototyping boards 44 can be connected.

The I/O probing system control unit 32 can read from the prototyping boards the complete or partial state information relating to a design verification targeted circuit implemented on-any of the prototyping boards 44, at a time point or situation as desired by a user, and conversely the unit 32 can write specific state information into the board.

To this end, a semiconductor chip mounted on any of the prototyping boards is required to have three physical pins for providing an operational mode controlling (normal mode*/probing mode) signal, a probing mode controlling (input probing*/output probing) signal and a probing clock, and one or more I/O pins capable of providing I/O probing data signals. In addition, a connector connected to those pins on the board is provided so that the pins are connected to the I/O probing interface module 26.

Also, in case of performing I/O probing of memories built in the semiconductor chip, one additional physical pin serving as a probing memory read/write (absent*/present) signal is required to be connected to the I/O probing interface module 26.

It is noted that the term of state information means to represent values stored in memory components, such as a flip flop or a latch, of a digital circuit and the content stored in memories such as RAMs or ROMs. The complete state information means values stored in all memory components and the whole content stored in all memories, and the partial state information denotes values of some memory components and/or contents of some memories included in the targeted circuits.

It is noted that the terms of the memory components and the memory are used in different meanings, respectively. The term of the memory component is used to indicate a flip flop or a latch, while the term of the memory is used to indicate RAMs (random access memory) or ROMs (read only memory).

A method for performing I/O probing for a circuit in which no memories are provided will be explained below, but a method for performing I/O probing for a circuit having memories will be explained thereafter.

An I/O probing system software in the I/O probing system control unit 32 shown in FIG. 1 comprises an I/O probing circuit synthesizer that generates automatic probing version of the designed circuit to be verified (the targeted circuit) so that I/O probing for the circuit becomes possible. The I/O probing circuit synthesizer can generate a circuit completed in an automatic manner (which is hereinafter called "expanded verification target circuit") by incorporating an additional IOP-probing circuit to the verification targeted circuit.

In an output probing mode, the additional IOP-probing circuit further included in the expanded verification target circuit may be implemented by a shift register, and serves to apply logical values of all or some of memory components in the verification target circuit to the shift register, before its shifting operation clocked by the probing clock is made.

In an input probing mode, the additional circuit implemented by the shift register also performs the shifting operation. Under the input probing mode, the additional circuit performs the shifting operation so as to apply input probing values to all or some of the memory components in the verification target circuit. The start-up operation of the additional circuit is made by synchronous set or synchronous reset operation, by synchronous set or synchronous reset operation subsequent to asynchronous set or asynchronous reset operation, or by synchronous disable operation subsequent to asynchronous set or asynchronous reset operation.

In the normal mode, another function of the additional IOP-probing circuit is to provide a circuit by which functional logical behaviors of the verification target circuit remains still unchanged, even if the additional circuit is added.

In case the verification target circuit is to be implemented using HDL (hardware description language) codes, the complete HDL codes are attained by adding the additional HDL codes expressing the behaviors of the additional IOP-probing circuit to the HLD codes for the verification targeted circuit.

Immediately before the shifting operation clocked by the probing clock is made, signal lines for register HDL codes holds output signals values from all or some of the memory components to be verified through the output probing.

Under the input probing mode, the HDL codes portions by the additional HDL codes is of the shift register structure, and therefore performs the shifting operation clocked by the probing clock.

The input probing targeted signals of the HDL codes by such a shifting operation undergo synchronous set or synchronous reset operation, synchronous set or synchronous reset operation subsequent to asynchronous set or asynchronous reset operation, or synchronous disable operation subsequent to asynchronous set or asynchronous reset operation, whereby logical values of the input probing targeted signals becomes the input probing values.

In the normal mode operation, another function of the additional IOP-probing HDL codes is to invariably maintain behaviors of the HDL codes during verification included in the expanded verification HDL codes, even if the additional HDL codes are added.

Figure 2:
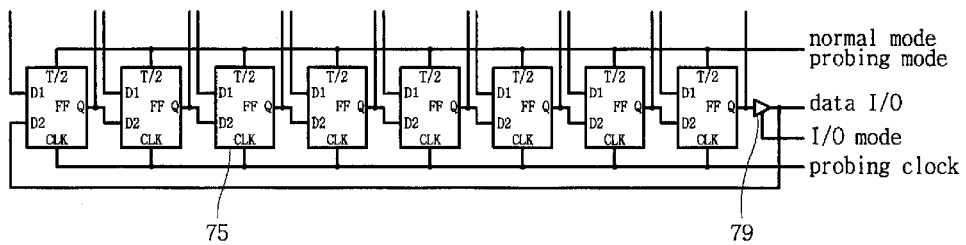
FIG. 2 is a schematic view of one example of a shaft register array structure in which a parallel load and a serial load constructed as an IOP-probing supplementary circuit is available according to an input/output mode in accordance with the present invention.

FIG. 2 schematically shows one example of a shift register array selectively providing parallel loading and serial loading operations under I/O mode settings, implemented by two-input D type flip flops 75 and a tri-state buffer 79 to form the additional IOP-probing circuit.

Figure 3:
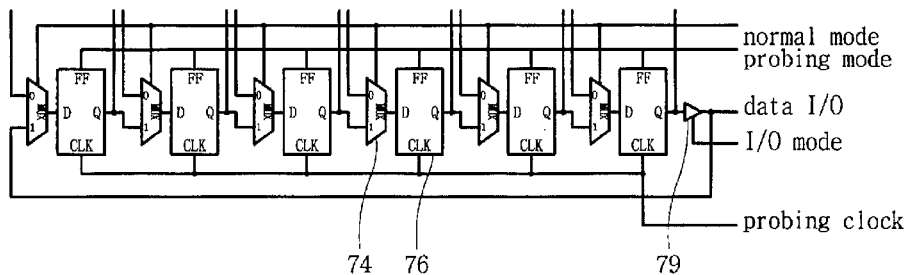
FIG. 3 is a schematic view of another example of a shaft register array structure in which a parallel load and a serial load of FIG. 2 is available according to an input/output mode in accordance with the present invention.

FIG. 3 schematically shows another example of a shift register array formed using single input D type flip flops 76, a tri-state buffer 79 and multiplexer 74.

Figure 4:
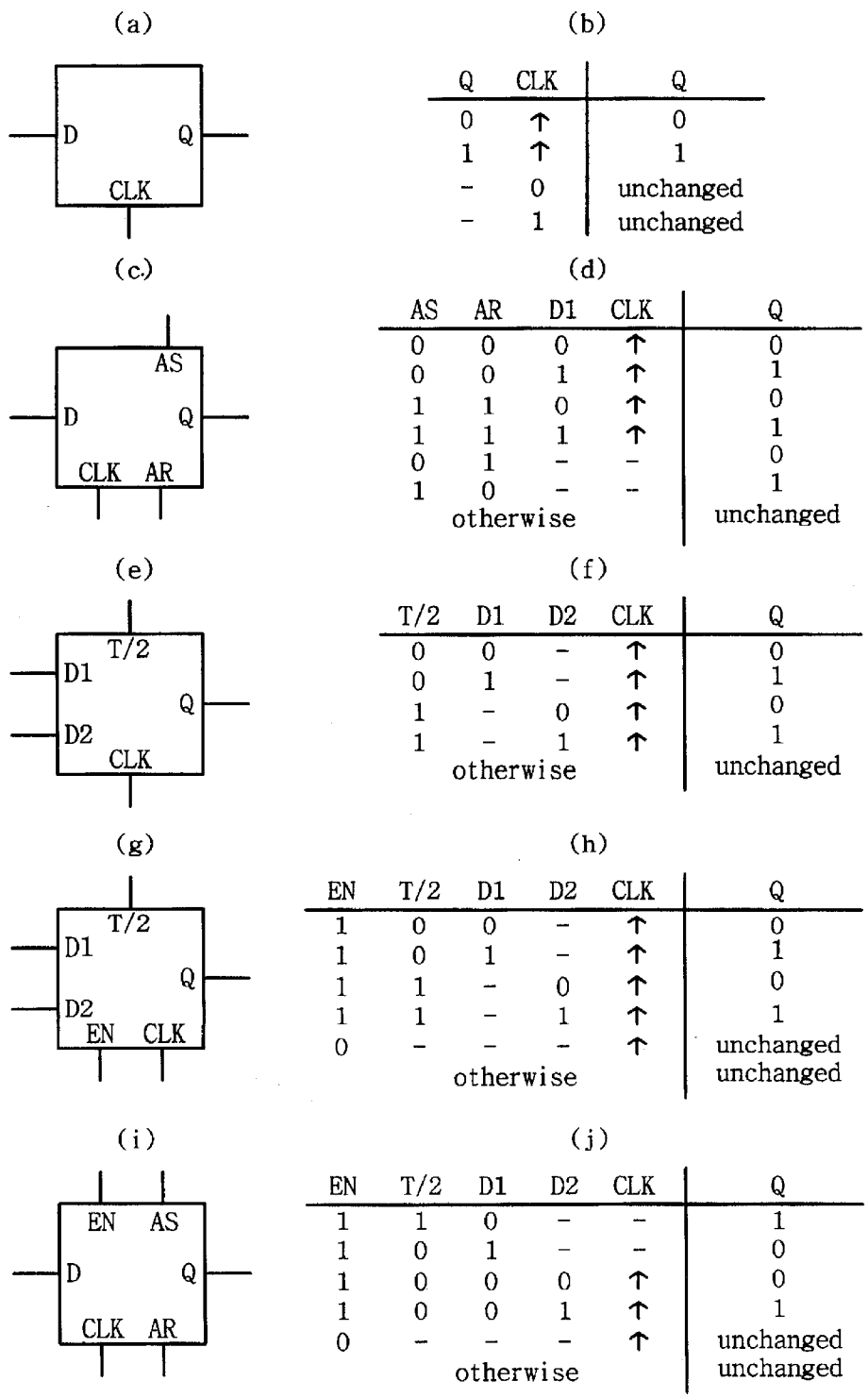
FIGS. 4A and 4B are schematic views showing a symbol and a functional function of a single input D-type flipflop having a single data input (D) in accordance with the present invention.
FIGS. 4C and 4D are schematic views showing a symbol and a functional function of a single input D-type flipflop having a single data input (D) and an asynchronous set/reset (AR/AS) in accordance with the present invention.
FIGS. 4E and 4F are schematic views showing a symbol and a functional function of a dual-input D-type flipflop having two data inputs (D1, D2) in accordance with the present invention.
FIGS. 4G and 4H are schematic views showing a symbol and a functional function of a dual-input D-type flipflop having two data inputs (D1, D2) and effective (EN) input in accordance with the present invention.
FIGS. 4I and 4J are schematic views showing a symbol and a functional function of a D-type flipflop having a data input (D), an asynchronous set (AS) and an asynchronous reset (AR) and a synchronous effective (EN) input in accordance with the present invention.

FIG. 4 shows symbols representing various D type flip flops and the functions thereof, used in an additional IOP-probing circuit, including the shift register array.

Figure 6:
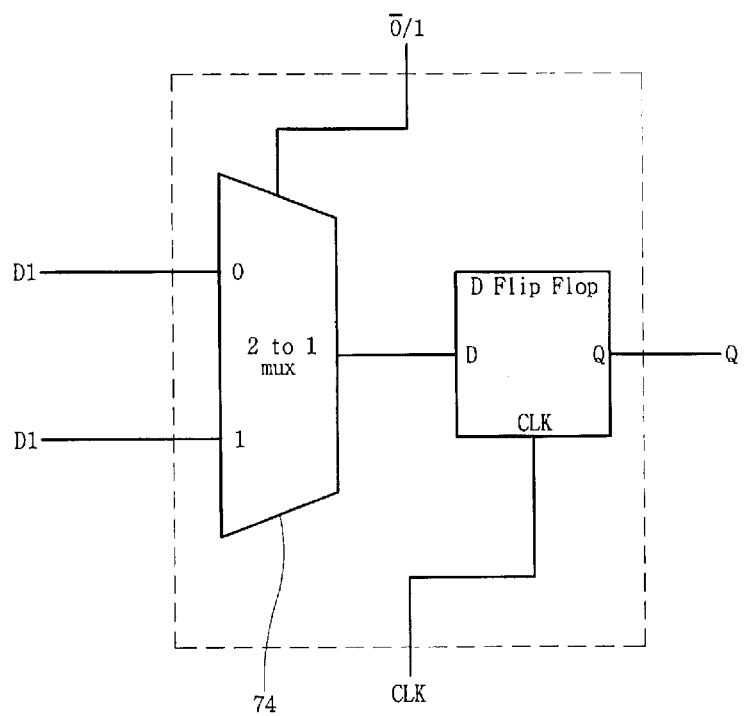
FIG. 6 is a schematic view showing an example of implementation of the dual-input D-type flipflop of FIG. 4A in accordance with the present invention.

FIG. 6 schematically shows an example which the dual input D type flip flops in FIG. 4 are implemented by multiplexer 74 and the signal input D type flip flop.9.

Assuming that a RFPD 12 is employed as a semiconductor chip used for implementing the circuit, one approach to embody functions of the additional IPO-probing circuit will be explained in detail.

The additional IOP-probing circuit may be implemented by one or more shift register arrays capable of selectively providing parallel-loading or serial-loading functions in response to a change in mode, which function is accomplished by dual input flip-flops and signal lines from the memory components to be probed which are built in one or more RFPD chips.

In the output probing mode, each one input of the dual input flip flop is connected to the output signal line from the targeted memory component so that the logical values on the output signal lines can be parallel loaded to the each of the flip flops. Thereafter, the output from one flip flop in an each array of the one or more shift registers is logically connected to the I/O pins functioning as one or more output probing lines of the related RFPD, and, according to the shifting operation clocked by the probing clock, the logical values of all flip flops constituting the shift register are sequentially appeared on the I/O pins serving as the output probing lines.

In such an output probing mode, the targeted signal lines may be a candidate for the output lines of the memory components, but they may be used as the output lines of the combinational gates. In the input probing mode, the input probing action is taken only for the output lines of the memory components so that the input probing values can be stored in the memory components. With such a configured shift register array, the output from one flip flop in an array of the one or more shift registers that a serial load becomes possible is logically connected to one of the I/O pins functioning as one or more input probing lines of the associated RFPD. Thereby, by the shifting operation clocked by the probing clock, the input probing values supplied from the external through the I/O pins functioning as the input probing lines can be loaded to the shift register in a serial manner. Further, in case a system clock (which means a clock globally used throughout the targeted circuit) is directly connected to the clock input of the related memory components to be input probed, each output of the flip flops constituting an array of the shift register that a serial load is possible is connected one date input of the dual input flip flop replacing each of the related memory components driving each of the input probing target signal lines.

Meanwhile, in case of being not directly connected to the system clock, i.e. in case of using a gated clock or a clock locally generated, the respective memory components driving the respective input probing target signal lines are replaced with the dual input flip flops each having asynchronous set and asynchronous reset. These asynchronous set and reset inputs are controlled by the output lines of the flip flops having the input probing values for the targeted memory components, the operational mode controlling line, and output lines of a finite state machine (FSM) for probing the memory components, thereby making it possible asynchronous reset or asynchronous set of the memory components at specified time point. Also, the output line of the flip flop having the input probing values for the memory component are connected to one data input of the dual input flip flop replacing the targeted memory components of the user's circuit. Thus, by synchronous set or synchronous reset subsequent to the asynchronous set or asynchronous reset, the outputs of the input probing target memory components can take either of logical values "0" or "1" which the flip flop having the input probing values for the memory components is holding.

Meanwhile, in case the clock inputs of the memory components are not directly connected to the system clock, as alternative method different from the above described method, the respective memory components driving the respective input probing target signal lines are replaced with the flip flops each having asynchronous set, asynchronous reset and synchronous enable. These asynchronous set and asynchronous reset inputs are controlled by the output lines of the flip flops, among the flip flops constituting an array of the shift register, having the input probing values for the targeted memory components, the operational mode controlling line, and the output lines of the FSM for probing the memory components, thereby making it possible asynchronous reset or asynchronous set of the memory components at specified time point. Also, another output lines of the FSM for the probing are connected the synchronous enable of the flip flop replacing the memory components of the user's circuit to be input probed, so that the output of the input probing target memory components are set to have either of logical values "0" or "1" which the flip flop having the input probing value for the memory components is holding.

Rather than using the flip flops present in the targeted circuit, separate new flip flops can be employed as the flip flops used in an array of the shift register providing the parallel and serial loading according to the change in mode. Alternatively, some portions among the flip flops used in the shift register array may be selected from the flip flops constituting the targeted circuit, and the use of selected flip flops may need the modification to further add, for example, synchronous enable and a multiplexer.

In case of the former, the advantage is that the minimal disturbance to the targeted circuit is guaranteed during the input probing performance. In case of the latter, the advantage is that the minimal overhead for the input probing is possible.

To attain such an input probing performance, it requires to additionally have the FSM for probing the memory components. It is noted that the FSM functions to create and provide the set/reset enable signal such that the asynchronous set or asynchronous reset occurs in the input probing target memory component by the signal values supplied from the shift register array, only at a time point as necessary, or functions to provide, as the input data selection signal of the dual input flip flop subsequent to the asynchronous set or asynchronous reset, the synchronous set or synchronous reset to the dual input flip flop. Or, the FSM also functions to create and provide the set/reset enable signal such that the asynchronous set or asynchronous reset occurs in the input probing target memory component by the signal values supplied from the shift register array, only at a time point as necessary, or functions to create and provide the synchronous set or synchronous reset.

For this, the intended control for the asynchronous set and asynchronous reset of the input probing targeted memory components should be possible using the output lines of the flip flop of the shift register array having the input probing values for the targeted memory components, the set/reset enable signal lines from the FSM for probing the memory components, and the operational mode controlling (normal mode*/probing mode) signal lines. This requirement can be attained by defining simple combinational functions. Also, in case all or some of the memory components used in the target circuit already have the asynchronous set and the asynchronous reset and the system clock is directly not connected to the clock inputs of those memory components, it is not difficult to try the modification of the circuit to the additional IOP-probing circuit including the control circuit unit driving the asynchronous set and asynchronous reset inputs, by replacing the above memory components to be input probed with the dual input flip flop having the asynchronous set/reset, or a single input flip flop having the asynchronous set/reset and the synchronous enable, while the functional logical behavior of the original targeted circuit remains unchanged in the normal mode.

Figure 5:
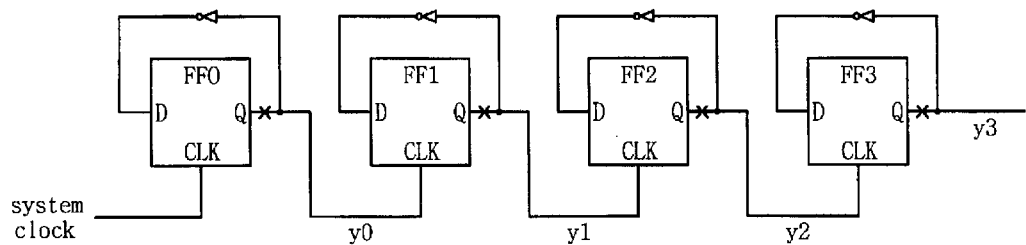
FIG. 5 is an exemplary view of an asynchronous circuit, that is, a 4-bit asynchronous binary counter in accordance with the present invention.

FIG. 5 illustrates an implementation of the above example, showing four-bit asynchronous binary counter consisting of D type flip flops 76 and an inverter gate. The physical connection (which is contrasted with the logical connection) of the system clock to all the flip flops shown in FIG. 5 is not shown, which is called the locally generated clock. For the four-bit asynchronous binary counter shown in FIG. 5, the system clock of the circuit is not physically connected to the remaining three flop flops other than one flip flop used for the least significant bit.

To enable the I/O probing for all four bits output lines of the four bit asynchronous binary counter, one example of expanded targeted circuit to which the additional IOP-probing circuit is added is shown in FIG. 7a.

In the output probing mode, the configuration of the circuit shown in FIG. 7a is such that the parallel load function of the shift register array is made possible by the signal lines to be probed and the dual input flip flops (PFF0, PFF1, PFF2 and PFF3 in FIG. 7a), along with the targeted circuit. Simultaneously, it is made possible the parallel loading of the logical values of the targeted signal lines into the dual input flip flops, by connecting each one input D1 of the dual input flip flops to each of the targeted signal lines y0, y1, y2, y3.

In case of the output probing mode, the outputs of one flip flop present in the shift register (in this case, indicates the rightmost flip flop PFF3) may be logically connected to the I/O probing line. In the input probing mode, the input of one flip flop (in this case, indicates the leftmost flip flop PFF0) present in each of the parallel loadable shift register may be logically connected to the input probing line.

Each of the outputs (p0, p1, p2 and p3 of FIG. 7a) of the flip flops constituting the parallel loadable shift register array is connected to one input of the dual input flip flop (FF0 in FIG. 7a) replaced among the flip flops (FF0, FF1, FF2 and FF3 in FIG. 5) driving the targeted signal lines (here, indicate y0, y1, y2 and y3), respectively (This may correspond to the case where the system clock is connected to the clock inputs of the associated flip flops, and thus here only the FF0 is considered).

Alternatively, by being replaced with the dual input flip flops having the asynchronous set and the asynchronous reset and controlling these set and reset inputs, the values held in the flip flops may be the desired input probing values. Thereafter, a data is input to the dual input flip flop (here, D2) connected to the output of the related flip flop among the flip flops constituting the shift register array. Thus, with the final synchronous set or synchronous reset, the output of the above flip flop can be set to either of "0" or "1" (this corresponds to the case where the system clock is not connected to the clock inputs of the related flip flops, and thus here FF1, FF2 and FF3 are considered).

Meanwhile, for this, it is required to further add the FSM for probing the memory components. The functions of the FSM here is that the asynchronous set or asynchronous reset for the input probing targeted flip flops occurs by the signal values supplied from the shift register array, only at a time point as necessary, and that the final synchronous set or synchronous reset for the dual input flip flops occurs by the logical values of the associated flip flop among the flip flops constituting the shift register array.

For this, the combinational circuit's functions as shown in FIG. 7b are necessary so that the asynchronous set and asynchronous reset of the input probing targeted flip flops can be controlled using the signal lines of the shift register array, the signal lines from the FSM for probing the memory components, and the operational mode controlling (normal mode*/probing mode) signal lines. If the meanings of the inputs and outputs of the FIG. 7a combinational circuit are differently coded (for example, the meanings of "0" and "1" of the FSMOut are conversely analyzed), the truth table shown in FIG. 7b is modified.

FIG. 7c shows one example of another expanded targeted circuit to which the additional IOP-probing circuit is added to make it possible the I/O probing for all four bits output lines of the four bit asynchronous binary counter.

Difference between both FIGS. 7a and 7c is that, in case of FIG. 7a, for the flip flops FF1, FF2 and FF3 using the locally generated clock, the dual input flip flops having the asynchronous set/reset are used to perform the input probing with the synchronous set or synchronous reset subsequent to the asynchronous set or asynchronous reset, while in case of FIG. 7c, the single input flip flops having the asynchronous set/rest and the synchronous enable are used to perform the input probing with the synchronous disable subsequent to the asynchronous set or asynchronous reset.

For the implementation as shown in FIGS. 7a and 7c, totally separate new construction was used for all flip flops used in the shift register array providing both the parallel and serial loadings according to the mode change, rather than using the flip flops present in the design verification targeted circuit. However, in such a case, the merit is that the minimal disturbance to the targeted circuit is possible during the I/O probing performance, but a drawback of a larger overhead may appear instead.

The implementation as shown in FIGS. 7e and 7g can provide the minimal overhead for the I/O probing by some of the flip flops constituting the shift register array being selected among the flips flops present in the targeted circuit and modified the selected ones.

In case of the four bit asynchronous binary counter, the smallest scale of the circuit constitution may comprise only one flip flop directly connected to the system clock, but in case of a typically larger scale of the circuit constitution, since there are mostly the numerous flip flops directly connected to the system clock, the above described scheme is highly preferable in that it greatly reduces the overhead for the I/O probing, wherein the scheme uses, as some the flip flops in the shift register array, the flip flops partially present in the targeted circuit.

FIG. 8a illustrates the case where one or more flip flops 78 in the targeted circuit already have the asynchronous set and the asynchronous reset and the clock inputs of those flip flops are, not directly connected to the system clock, but connected to the locally generated clock or the gated clock.

In this case, as a first method, the flip flops to be input probed are replaced with the dual input flip flops 77 as described above, such that the functional logical behaviors of the original circuit to be verified remains unchanged, even if the circuit is modified by adding the additional IOP-probing circuit including the combinational control circuit driving the asynchronous set and asynchronous reset inputs of the replaced ones.

FIG. 8b shows such a situation, and the truth table for the combinational control circuit used is shown in FIG. 8c. The functions of the FSM for probing the memory components and synchronized and driven by the probing clock is to create the asynchronous set/reset enable signal (which is activated in this case), such that, in the input probing mode, the input probing occurs only at specific n-th cycle of the probing clock, by controlling the asynchronous set input and asynchronous reset input of the dual input flip flops replacing the flip flop to be input probed by using the input probing values stored in specific flip flops in the shift register array constituting the additional IOP-probing circuit at specific n-th cycle of the probing clock. Also, another function is to create the asynchronous set/reset enable signal (which is disabled in this case), such that the asynchronous set and asynchronous reset of the dual input flip flops replacing specific flip flops to be input probed are disabled at the cycles other than said specific n-th cycle. Meanwhile, in the normal operation mode, the asynchronous set/reset enable signals (which are disabled in this case) are created, which signals allow the expanded targeted circuit to become functionally equal to the original targeted circuit. Thereby, the control circuit unit is driven which is connected to the asynchronous set input and asynchronous reset input of the dual input flip flop replacing the targeted flip flops. Also, the control is made such that, with the logical values of the associated flip flops among the flip flops constituting the shift register array, the final synchronous set or synchronous reset of the dual input flip flop occurs.

As a second method, the flip flops to be input probed are replaced with the single input flip flops 73 having the synchronous enable, as previously described, and the circuit modification is made with the additional IOP-probing circuit added along with the combinational control circuit, while the functional logical behaviors of the original targeted circuit remain unchanged. Such a situation is shown in FIG. 8e. The truth table of the combinational control circuit used in this case is shown in FIG. 8f.

The functions of the FSM for probing the memory components and synchronized and driven by the probing clock is to create the asynchronous set/reset enable signal (which is activated in this case), such that, in the input probing mode, the input probing occurs only at specific n-th cycle of the probing clock, by controlling the asynchronous set input and asynchronous reset input of the single input flip flops having the synchronous enable and replacing the flip flop to be input probed by using the input probing values stored in specific flip flops in the shift register array constituting the additional IOP-probing circuit at specific n-th cycle of the probing clock. Also, another function is to create the asynchronous set/reset enable signal (which is disabled in this case), such that the asynchronous set and asynchronous reset of the single input flip flops replacing specific flip flops to be input probed are disabled at the cycles other than said specific n-th cycle. In the normal operation mode, the function of the FSM is to create the asynchronous set/reset enable signals (which are disabled in this case) allowing the expanded targeted circuit to become functionally equal to the original targeted circuit. Thereby, the control circuit unit is driven which is connected to the asynchronous set input and asynchronous reset input of the single input flip flop replacing the targeted flip flops. Also, the control is made such that, with the synchronous enable signal generated from the FSM after the input probing performance by the asynchronous set or asynchronous reset, the current values of the flip flops related are maintained at the specific time point.

In case of using RS, JK or T type flip flop other than D type flip flop used in designing the circuit, the D type flip flop and simple combinational circuit are used together to constitute a circuit functionally equal to those structures, and then, the above equivalent circuit is implemented. In the probing method according to the present invention, the method for generating the additional probing circuit can also be applied to the case of using any kind of flip flops to constitute a circuit.

In case latch elements are used for the memory components used in the targeted circuit, prior to the use of the above methods, respective latches are modified as shown in FIG. 9 by using the flip flops and combinational circuit, so that a circuit functionally equivalent to the original latch can be obtained, and then the above methods are applied.

In case there are the memory components which use clock inputs gated by the result that the I/O probing system control unit investigates the targeted circuit, an example of another method for implementing the function of such an additional IOP-probing circuit is that the system control unit synthesizes in an automated manner circuits fully synchronized with respect to the system clock and which are functionally equivalent to the original targeted circuit and the synthesized circuits are used as new targeted circuits instead of the original targeted circuit.

Thereafter, the signal lines of the targeted memory components and dual input flip flops in one or more RFPDs having the targeted circuit implemented are used to allow the additional IOP-probing circuit to become one or more shift register arrays proving selectively the parallel loading and serial loading functions according to the change in mode. Then, in the output probing mode, after one input of the respective dual input flip flops and the output signal lines of the targeted memory components are connected together to made it possible the parallel loading of the logical values on the output probing targeted signal lines to each of said dual input memory components, the output of one flip flop present in each of one or more shift register arrays is logically connected to one of the I/O pins functioning as one or more I/O probing lines of the related RFPD, and then, according to the probing clock of the shift register and the synchronized shifting operation, the logical values of all flip flops of the shift register are allowed to sequentially appear on the I/O pins serving as the I/O probing lines. The input probing mode logically connects to the I/O pins serving as one or more input probing lines of the related RFPD the inputs of the flip flops present in each of one or more shift register arrays having the possible parallel and serial loading functions according to the change in mode. Thereby, with the probing clock and the synchronized shifting operation, the input probing values sequentially supplied from the external through the I/O pins serving as the input probing line can be loaded to the shift register in a serial manner. Also, since the system clock is directly connected to the clock input of all memory components to be input probed, the respective outputs of the flip flops constituting one or more shift register arrays whose the parallel loading function is possible can be connected to one input of the dual input flip flops driving the respective signal lines to be input probed.

In case the memories such as RAMs or ROMs are further included in the targeted circuit and on-chip memory having such memories built in the RFPD is used for the implementation, an additional memory read/write circuit is further incorporated to the additional IOP-probing circuit. The on-chip memory may be, specifically, a distributed RAM manufactured by XilinX FPGA, BlockRAM, or Embeded System Block from BlockRAM, Altera FPGA.

In the output probing mode, the I/O probing system control unit controls the additional memory R/W circuit to read all the contents in all or specific areas in a predetermined order and to send in an automatic manner them to the I/O probing system control unit through the output probing line, a relay module and then a relay cable.

Meanwhile, in the input probing mode, the additional memory R/W circuit writes the data held in the I/O probing system control unit into all or specific areas of a writable memory within the targeted circuit implemented in the RFPD, through the relay cable and relay module and the input probing line of the RFPD, in an automatic manner and predetermined order.

Figure 10:
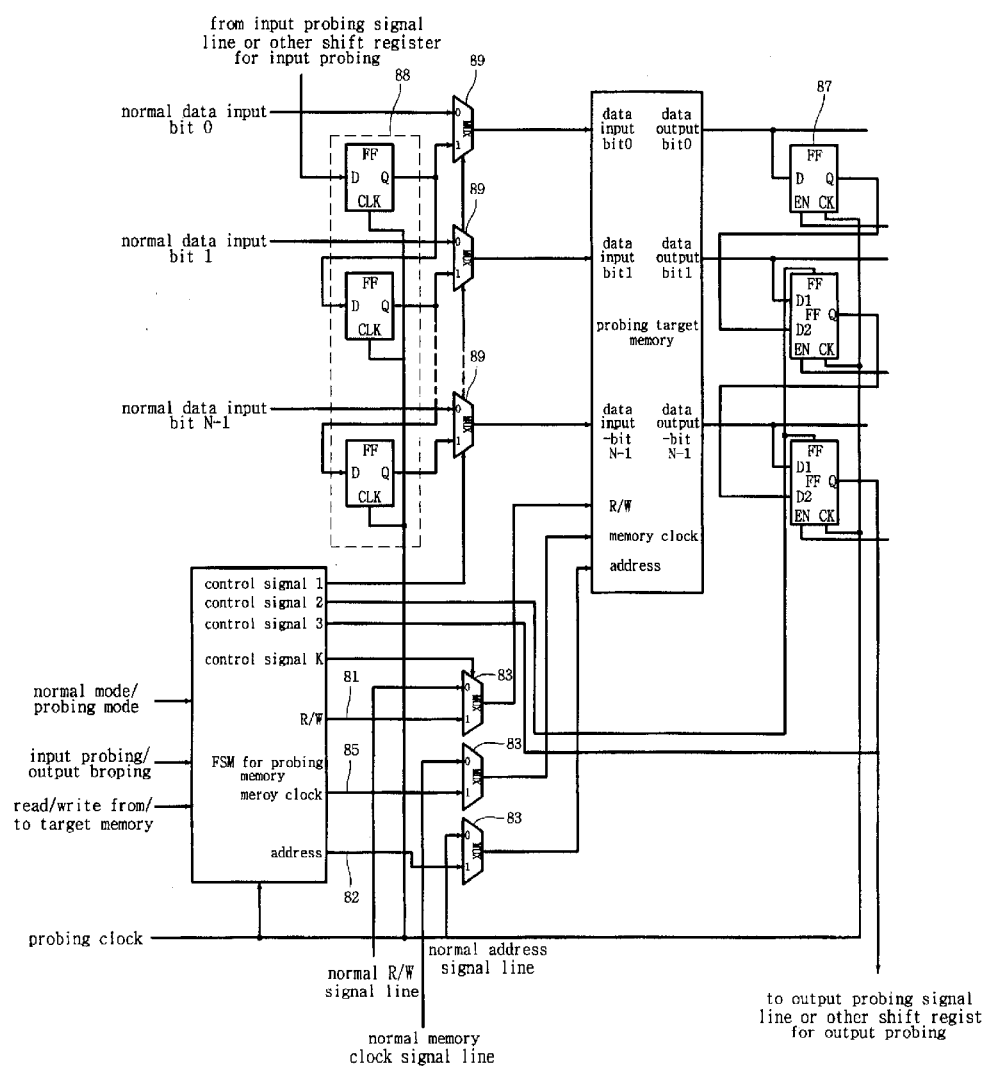
FIG. 10 is a schematic view showing an example of implementing a memory probing finite state machine as a supplementary circuit for probing a memory in accordance with the present invention.

One specific example of implementing such an additional memory R/W circuit may be attained by the combination of flip flops, multiplexers, and FSM which generates R/W control signal for the memory and address sequences for all areas of the memory to/from which the read/write operations are performed, and further generates clock signals in preparation for clocked memory employed, as necessary. FIG. 10 shows such an example in detail. The following is to explain the operation of such a configured additional memory R/W circuit.

In the output probing mode, the FSM 90 for probing the memory has input lines for receiving the operational mode controlling (normal mode*/probing mode), the probing mode controlling (input probing"/output probing) signal line and the memory R/W (absent"/present) signal line for the probing.

Also, the FSM 90 clocked by the probing clock generates a R/W control signal 81 for the memory, address signal 82 for specific address, a selective input signal 84 for multiplexer 1 83 in a memory input stage, and memory clock signal 85, and has output lines which output the R/W control signal 81 and the address signal 82.

If it is needed, the memory clock signal 85 is also permitted to appear on an output part of the multiplexer 1 83 so that the current contents held in specific address can be thereby present on an output part 85 of the memory. Then, an enable signal for the flip flops 87 in a memory output stage is generated to store the values of the memory output stage 86 in the flip flops 87. Thereafter, an input selective signal for the flip flops 87 is generated, thereby the flip flops 87 being used as a shift register synchronized with the probing clock which performs the shifting operation through which the current contents in specific addresses sequentially appears on the output probing line. Thus, the read-in of the current contents held in specific addresses is possible. The FSM 90 automatically, orderly performs the read-in operation for all addresses of the memory.

In the input probing mode, the FSM 90 receives the operational mode controlling (normal mode*/probing mode) signal line, the probing mode controlling (input probing*/output probing) signal line, the memory R/W (absent*/present) for the probing, and the probing clock, and in respense thereto, provides, on the output part of the multiplexer 1 83 in the memory input stage, the memory R/W control signal 81, the address signal 82 for specific address, and the selective input signal 84 for the multiplexer 1 83 in the memory input stage. Thus, the specific address of the memory to which the write is to be performed can be accessed. Then, in response to the probing clock input, the shift register 88 in the memory input stage performs the shifting operation thereof, whereby the data to be written to the specific addresses of the memory are sequentially input through the input probing line. At a time point at which the shifting operation is completed, the data are stored in the shift register 88 in the data input stage, the selective signal for the selective signal lines of the multiplexer 2 89 in the data input stage is generated, and, if necessary, the memory clock signal 85 is generated, so that the data stored in the shift register 88 can be written to the specific addresses of the memory. The FSM 90 is operated to write the date into the specific addresses of the memory, as described above.

To read/write the memory, the FSM 90 internally may have an address generator for address areas of the R/W memory, and the above mentioned additional memory R/W circuit can also be applied to two-port memory, similarly.

Again, in order to perform the I/O probing operation in case of including the memory in the design verification targeted circuit, the I/O probing system control unit further has the additional IOP-probing circuit added to the targeted circuit to generate a target circuit expanded to one or more RFPDs, such that the additional IOP-probing circuit can perform the read/write operation from/to the memory, as well as the I/O probing operation for the targeted circuit.

In the present invention, the output probing line and the input probing line may exist as an separate uni-directional probing line, or as a bi-directional probing line that the output probing line and the input probing line are combined.

As a probing clock for use in the present invention, an extra clock, not the system clocks used for the design verification target circuit, may be used, or one of the system clocks may be used.

By adopting the above described input/output probing apparatus and method, an emulation/simulation mixed design verification can be performed by using an arbitrary prototyping board, on which at least one semiconductor chip is mounted in which an extended design verification target circuit formed by adding the IOP-probing supplemental circuit to the design verification target circuit is implemented, and an arbitrary simulator.

That is, the mixed emulation/simulation method for design verification includes a step in which the input/output probing system controller receives the memory and the probing target signal lines existing in the design verification target circuit or memory block and probing target signals existing in the design verification HDL code.

At this time, in order to implement a design verification target circuit in at least one RFPD mounted on the prototyping board, the output probing target signals lines or logic values in a specific time zone in the reading target memory region or at the time point when a particular situation occurs appear sequentially in the output probing line only for a predetermined time.

And, the mixed emulation/simulation method for design verification also includes a step in which an extended design verification target circuit is generated by adding the IOP-probing supplementary circuit to the design verification target circuit allocated in at least one RFPD mounted on the prototyping board, so that the input probing target signal lines or the writing target memory area can have logic values applied to the input probing line at a specific time zone.

For the output probing target signal lines and the reading target memory area, the logic values and the memory content at a specific time zone on the output probing target signal lines appear on the output probing line of the corresponding RFPD by using the IOP-probing supplementary circuit.

The value appearing on the output probing line is transmitted through the input/output probing interface module to the server computer, so that the simulator may have the current state information of the design verification target circuit as an initial state value for simulator.

Meanwhile, for the input probing target signal lines and the writing target memory area, input probing data is generated from the state information obtained through simulation in the server computer. Thereafter, the data is applied to the input probing target signal lines through a interface module and a interface cable while being synchronized only with the probing clock, or is applied thereto while changing suitably the probing mode to an input probing mode or to an output probing mode through a probing mode control signal line, so that the logic values transmitted through the input probing line are inputted to the logic value of the input probing target signal lines and to the memory area, so that the state information of the design verification target circuit implemented in the RFPD is identical to the state information generated through simulation for a predetermined time in the simulator.

For the mixed emulation/simulation in an automated manner by using the input/output probing apparatus and the input/output probing method, execution switching should be automatically made between emulation and simulation. This is called as execution mode switching, which is made when a specific condition is met (for example, at the time when a specific value is written in a specific register of a circuit twice). The condition is called an execution mode switching condition. There are at least two execution mode switching conditions in the overall verification process on a time basis, that is, a condition before a reference time and a condition after the reference time. In this case, in an arrangement from a first set condition to the later set condition, at a time point when a condition is met, the execution mode switching occurs from emulation to simulation or from simulation to a logic emulation.

For this purpose, the execution mode switching conditions need to be stored in a queue, which is called an execution mode switching condition queue. It is maintained in a data structure in the input/output probing system controller.

The extended design verification target circuit, which is generated by adding the IOP-probing supplementary circuit to the design verification target circuit, is implemented in at least one RFPD on the prototyping board.

In the course of performing a verification on the emulation basis by executing the prototyping board, in case where a switchover to simulation is needed at a specific time point or at a time point when a specific situation occurs, the input/output probing system controller detects it and stops performing of emulation.

After at least one RFPD is switched from a normal mode to an output probing mode under the control of the input/output probing system controller, when the probing clock is applied to the RFPD, the logic values of the signal lines, subjected to the probing through at least one output probing line connected to the output of a single flipflop existing in at least one shift register array structure, is transmitted to the server computer via the input/output probing interface module.

The input/output probing time point may be statically determined before performing emulation, or may be dynamically determined such as a time point when a specific situation occurs during performing of emulation.

In order to determine an input/output probing time point dependent on the emulation situation such as the time point when the specific situation occurs, an external equipment such as a logic analyzer is used to observe it and determine an input/output probing time point. Or, an input/output probing time point detector circuit for detecting an operation situation is added in the RFPD so as to output an input/output probing situation, which can be detected by the input/output probing system controller to start input/output probing.

In case that the input/output probing time point detector circuit is added together with the IOP-probing supplementary circuit to the design verification target circuit in the RFPD, its natural generation and addition is also handled by the input/output probing system controller.

The input/output probing apparatus and input/output probing method includes a step of receiving a memory and probing target signal lines existing in the design verification target circuit or a memory block and probing target signals existing in the design verification HDL code by the input/output probing system controller.

Also, the input/output probing apparatus and input/output probing method further includes a step in which, in order to implement a design verification target circuit in at least one RFPD mounted on the prototyping board, the output probing target signal lines or the logic values at a specific time zone in or at a time point when a specific situation occurs in the reading target memory area sequentially appear in the output probing line for a predetermined time, and in order for the input probing target signal lines or the writing target memory region to have logic values applied in a specific time zone in the input probing line, the IOP-probing supplementary circuit is added to the design verification target circuit allocated in at least one RFPD mounted on the prototyping board, thereby generating an extended design verification target circuit.

Also, the input/output probing apparatus and input/output probing method further includes a step in which, for the output probing target signal lines and the reading target memory area, the logic values and the memory content at a specific time zone on the output probing target signal lines appear in the output probing line of the corresponding RFPD by using the IOP-probing supplementary circuit, and the value appearing in the output probing line is transmitted through the input/output probing interface module to the server computer, and meanwhile, for the input probing target signal lines and the writing target memory area, after an input probing data is generated from the state information obtained by the server computer, the input probing data is synchronized only with the probing clock and applied to the input probing target signal lines of the corresponding RFPD through the input/output probing interface module, the input probing data is synchronized with the probing clock an applied to the input probing target signal lines of the corresponding RFPD through the input/output probing interface module while adequately changing the probing mode between the input probing mode and the output probing mode, so that the logic value of the input probing target signal lines and the content of the writing target memory region are replaced with the logic values transmitted through the input probing line, and thus, the state information of the design verification target circuit implemented in the RFPD is identical to the state information obtained by the server computer.

The mixed emulation/simulation method according to the input/output probing apparatus and the input/output probing method of the present invention includes: a step in which a design verification target circuit and a name of ASIC vendor library name are inputted to the server computer; a step in which probing target signal lines on the design verification target circuit required for mixed verification and a memory area are assigned additionally as required; a step in which the output probing target signal lines and the logic value at a specific time zone of the memory area appears for a predetermined time, and an extended design verification target circuit is generated by adding an IOP-probing supplementary circuit to the design verification target circuit implemented in at least one RFPD so that the input probing target signal lines and the memory area may have the logic values applied to the input probing line at a specific time zone; a step in which the extended design verification target circuit is implemented in at least one RFPD, and while the implemented design verification target circuit is being operated, output probing is performed for at least one RFPD under the control of the input/output probing system controller at an arbitrary time point set by a user or at a time point when a situation occurs, so that the content of the memory area and the logic values at the specific time zone of the output probing target memory devices can appear in the output probing line of at least one RFPD by using the IOP-probing supplementary circuit; a step in which the value of the thusly appeared value of the output probing line is transmitted through the input/output probing interface module to the server computer and automatically set as a simulation initial state value for performing simulation by a simulator; and a step in which the state information of the design verification targer circuit obtained through simulation at a time point set by the user or in a situation during simulation by simulator, is owned by the memory device and the memory area subjected to the input probing through the input probing line of the RFPD mounted on the prototyping board passing through the input/output probing interface from the server computer by employing the input probing method using the IOP-probing supplementary circuit, thereby automatically performing emulation following simulation.

The mixed emulation/simulation method according to the input/output probing apparatus and the input/output probing method includes a step in which a design verification target HDL code and an ASIC vendor library name are inputted to the server computer; a step in which probing target signals on the design verification target HDL code required for mixed verification and a memory area are assigned additionally as required; a step in which an extended design verification HDL code is generated by adding an IOP-probing supplemental HDL code to the design verification target HDL code implemented in at least one RFPD, so that output probing target signals and a logic value at a specific time zone fo the memory area appear in the output probing line only for a predetermined time and the input probing target signals and the memory area owns a logic value applied to the input probing line at a specific time zone; a step in which after the extended design verification target HDL code is implemented in the RFPD, while a circuit functionally equivalent to the implemented design verification target HDL code is being operated, output probing is performed for the RFPD at a time point set by the user or at a time point at which a situation occurs, so that logic values and the content of the memory area at the specific time zone of the output probing target memory devices appear in the output probing line of the RFPD by using the IOP-probing supplementary circuit; a step in which the value of the thusly appearing output proving line is transmitted through the input/output probing interface module to the server computer and automatically set as a simulation initial state value for performing simulation by means of a simulator; and a step in which the state information of the design verification target HDL code obtained through simulation at a time point set by the user or in a situation during simulation by simulator, is owned by the memory device and the memory area subjected to the input probing through the input probing line of the RFPD mounted on the prototyping board passing through the input/output probing interface from the server computer by employing the input probing method using the IOP-probing supplementary circuit, thereby automatically performing emulation following simulation.

Figure 11:
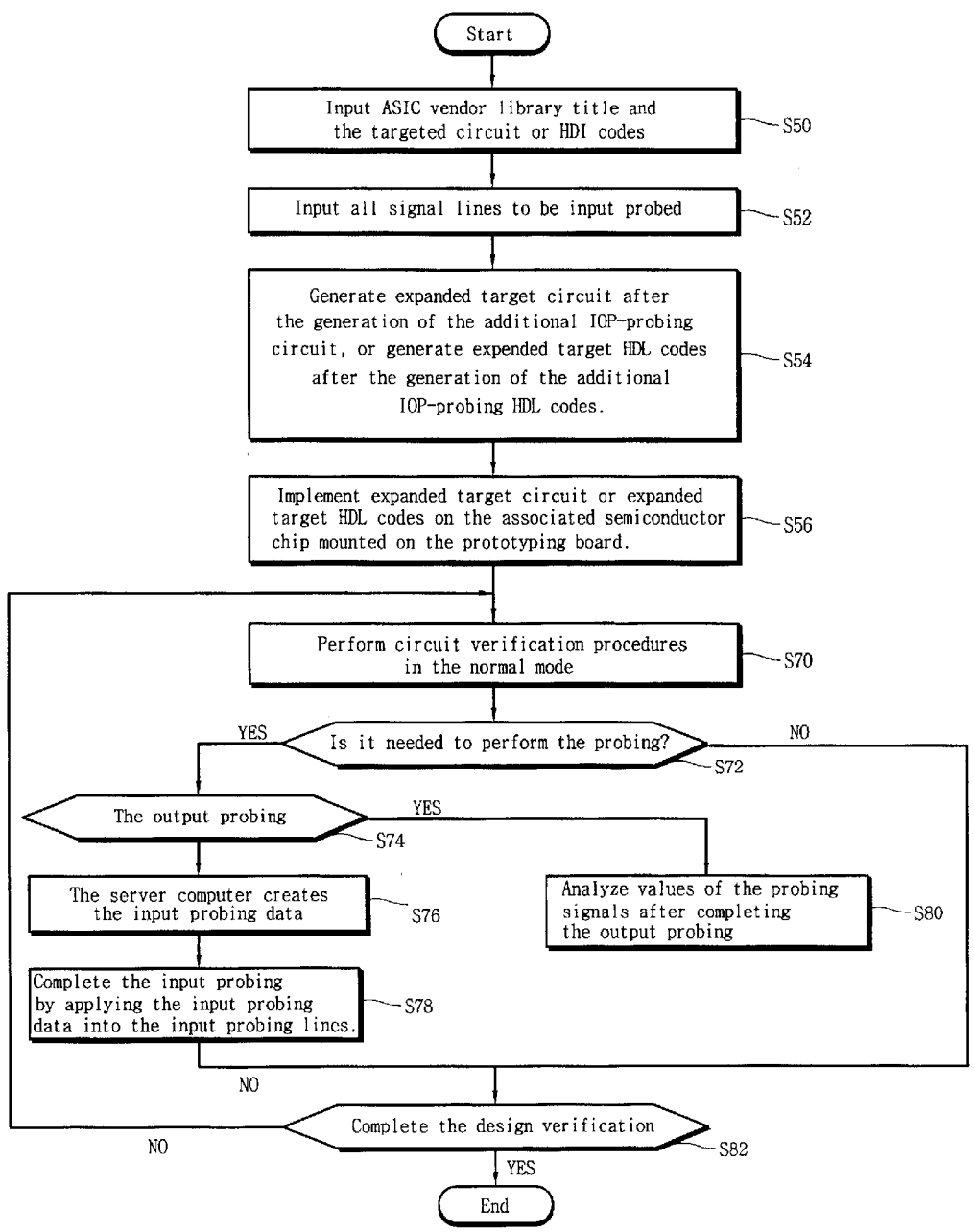
FIG. 11 is a flow chart of an embodiment of input/output probing by using the input/output probing apparatus of FIG. 1 in accordance with the present invention.

FIG. 11 is a flow chart of the input/output probing method in accordance with one embodiment of the present invention, which is performed by the server computer 20 of FIG. 1.

According to the input/output probing method, first an ASIC vendor library name and a design verification target circuit are inputted, or a target verification target HDL code is inputted (S50). An input/output probing target signal line is inputted (S52). After an IOP-probing supplementary circuit is generated by semiconductor chips of a prototyping board and added to a design verification target circuit, thereby generating an extended design verification target circuit, or after an IOP-probing supplementary HDL code is generated, it is added to a design verification target HDL code, thereby generating an extended design verification target HDL code (S54).The extended design verification target circuit or the extended design verification target HDL code is implemented in a corresponding semiconductor chip on the prototyping board (S56). In a normal mode, a circuit verification process is performed (S70). It is checked whether probing is to be performed (S72), and if probing is to be performed, it proceeds to the step S74, or otherwise, it proceeds to the step S82. In the step S74, it is checked whether it is output probing (S74), and if it is output probing, it proceeds to the step S80, or if it is input probing, it proceeds to the step S76. In the step of S74, a server computer generates an input probing data and proceeds to the step S78 (S76). In the step S78, after it is switched to an input probing mode, the server computer applies the input probing data to the input probing line through an input/output probing interface module to perform input probing and proceeds to the step S82 (S78). In the step S80, after it is switched to an output probing mode, the value appearing in the output probing line is transmitted through the input/output probing interface module to the server computer, thereby completing output probing, and proceeds to the step of S82 (S80). In the step S82, it is checked whether the design verification has been completed, and if it has been completed, the over process is ended, or otherwise, it proceeds to the step S70 (S82).

In this manner, the input/output probing apparatus and the input/output probing method of the present invention are employed, so that the design verification can be freely performed in turn without any restriction to the number of times of switching between emulation and simulation for the design verification target circuit.

Figure 12:
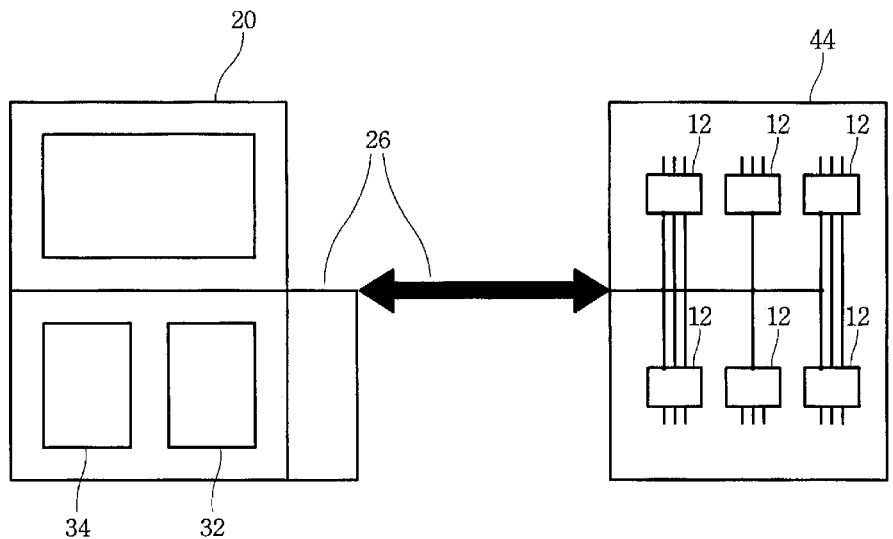
FIG. 12 is a schematic view showing mixed emulation/simulation environment in accordance with the present invention.

FIG. 12 is a schematic view showing a construction of a mixed verification environment using emulation and simulation as a stand-along mode. Though FIG. 12 has the same elements as those of the input/output probing apparatus of FIG. 1, the apparatus of FIG. 12 is different from that of FIG. 1 in the aspect that it further includes a simulator 34 to perform emulation and simulation mixedly.

The prototyping board perform emulation and the simulator for performing simulation are preferably performed in a distributed environment through network. Accordingly, FIG. 13 is a schematic view showing a construction of the mixed verification environment using emulation and simulation through a local and remote area network (36).

Figure 14:
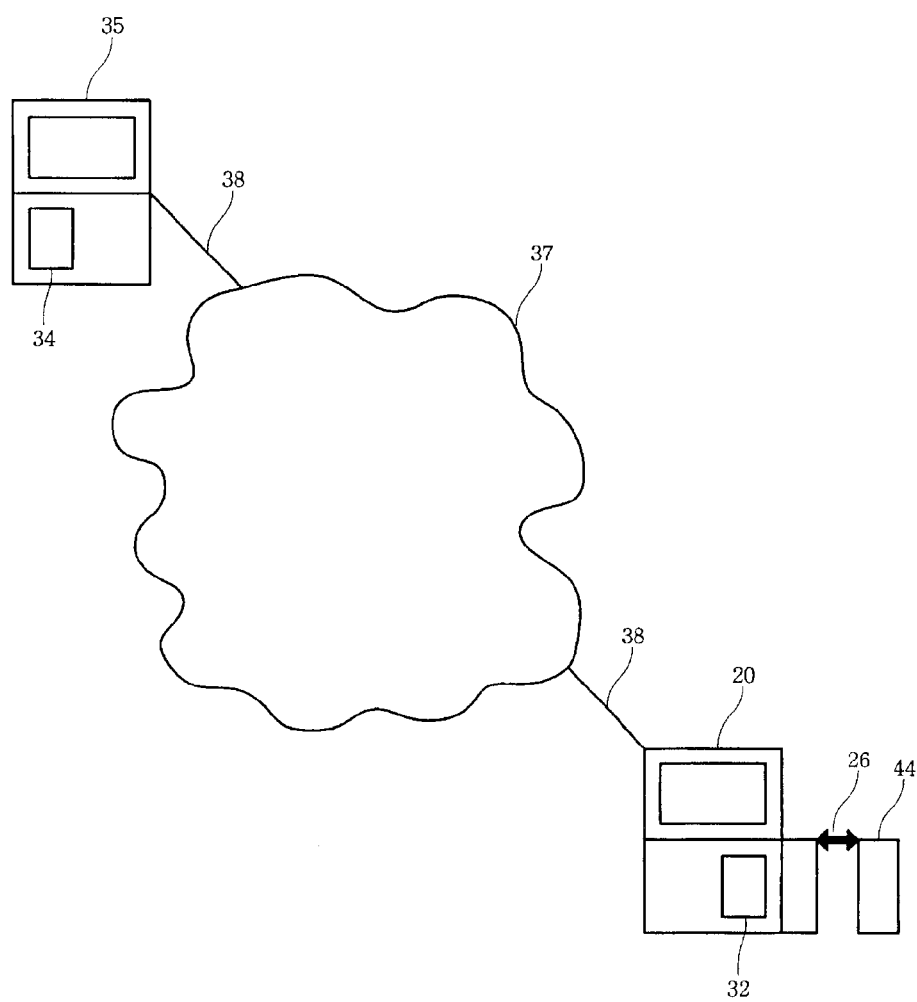
FIG. 14 is a schematic view showing a construction of mixed emulation/simulation environment through an inter-network in accordance with the present invention.

FIG. 14 is a schematic view showing an environment to perform emulation by employing the input/output probing apparatus consisting of the input/output probing interface module 26 and the input/output system controller 32, the prototyping board 44 and the server computer 20, and simulation by using the simulation server computer 34 and the simulator 35 in a distributed environment on the inter-network 37 (i.e., the Internet, etc) having a gateway 38.

Figure 13:
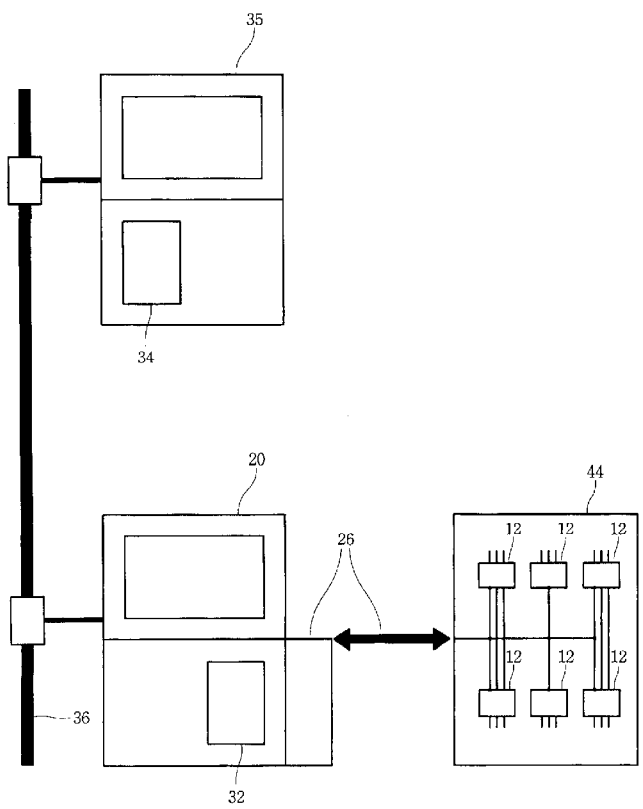
FIG. 13 is a schematic view showing a construction of mixed emulation/simulation environment through a local/remote area network in accordance with the present invention.
Figure 15:
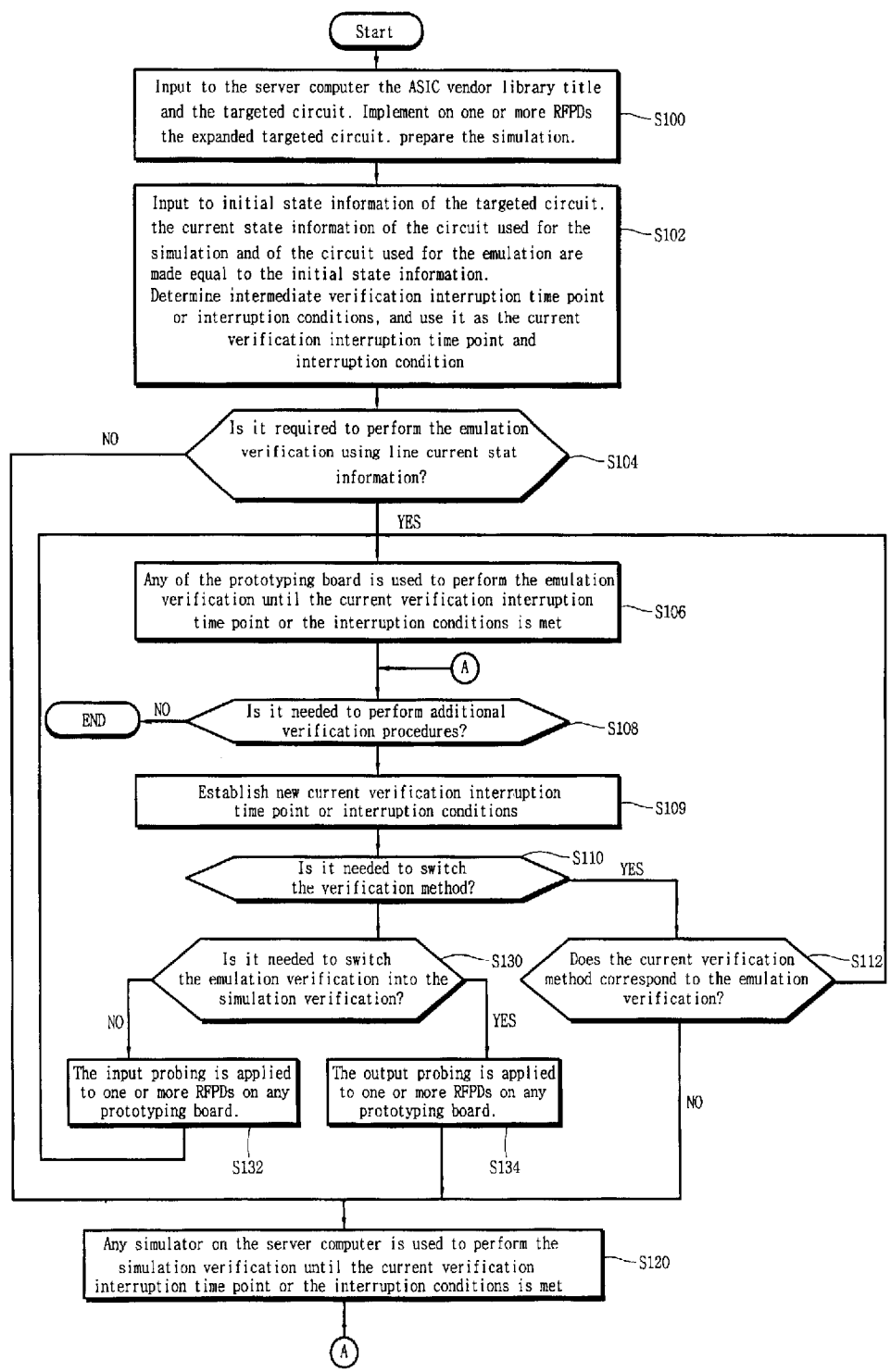
FIG. 15 is a flow chart of a design verification method according to one embodiment of the mixed emulation/simulation using FIGS. 12, 13 or 14 in accordance with the present invention.

FIG. 15 is a flow chart of the mixed emulation/simulation method by steps in accordance with one embodiment of the present invention, which is performed by the server computer 20 illustrated in FIGS. 12, 13 and 14.

In the step S100, after a design verification target circuit and an ASIC vendor library name used when designed are inputted by using the server computer, based on which an extended design verification target circuit is generated by adding an IOP-probing supplementary circuit to at least one RFPD of a prototyping board that can be subjected to input/output probing by using the input/output probing system controller in an automated manner, and the extended design verification target circuit is implemented in the RFPD on the prototyping board, and then server computer prepares to perform simulation of the design verification target circuit by using a simulator (S100).

In the step S102, an initial state information (values for every memory device (such as flipflops and latches) in a circuit) for the design verification target circuit subjected to the mixed verification of emulation and simulation are inputted by using the server computer 20 so that the current state information of a simulation circuit for a simulator and of an emulation circuit for a prototyping board can be the same as the initial state information, verification method switching time pint or switching condition sequence is determined and stored in an execution mode switching condition queue, of which the forefront of the queue becomes the current verification method switching time point and switching condition (S102).

In the step S104, it is determined whether simulation is to be performed or whether emulation is to be performed with the current state information (S104).

In case that emulation is performed, it proceeds to the step S106 and performs emulation by using the prototyping board until the current verification stoppage time point or stoppage condition is met (S106).

In the step S108, it is checked whether an additional verification process is required, and if it is not required, the overall process is ended, while, if it is required, it proceeds to the step S109 (S108).

In the step S109, it is checked whether the execution mode switching condition queue is empty, and if it is not empty, it proceeds to the step S115, while, if it is empty, it proceeds to the step S111 (S109).

In the step S111, it is checked whether a new verification method switching time point or switching condition sequence is to be stored in the execution mode switching condition queue, and if it does not need to be stored, it proceeds to the step S108, while, if it needs to be stored, it proceeds to the step S113 (S111).

In the step S113, the new verification method switching time point or switching condition sequence is stored in the execution mode switching condition queue and it proceeds to the step S115 (S113).

In the step S115, the current verification method switching time point and switching condition are newly set with the execution mode switching condition queue and proceeds to the step S117 (S115).

In the step S117, it is checked whether the current verification method is emulation or simulation, and if it is emulation, it proceeds to the step S134, while, if it is simulation, it proceeds to the step S132 (S117).

In the step S132, input probing is performed for the RFPDs so that the extended design verification target circuit implemented in the RFPD on the prototyping board has the same state information as the current state information of the design verification target circuit at the current verification stoppage time point obtained through simulation on the server computer, and proceeds to the step S106 (S132).

In the step S134, output probing is performed for at least one RFPD on the prototyping board so that the design verification target circuit being performed by the simulator on the server computer can have the same state information as the current state information of the design verification target circuit at the current verification stoppage time point obtained by output probing for the extended design verification target circuit implemented in the RFPD on the prototyping board and proceeds to the step S120 (S134).

In the step S120, simulation is performed by using the simulator until the current verification method switching time point or switching condition is met, and proceeds to the step S108 (S120).

Figure 16:
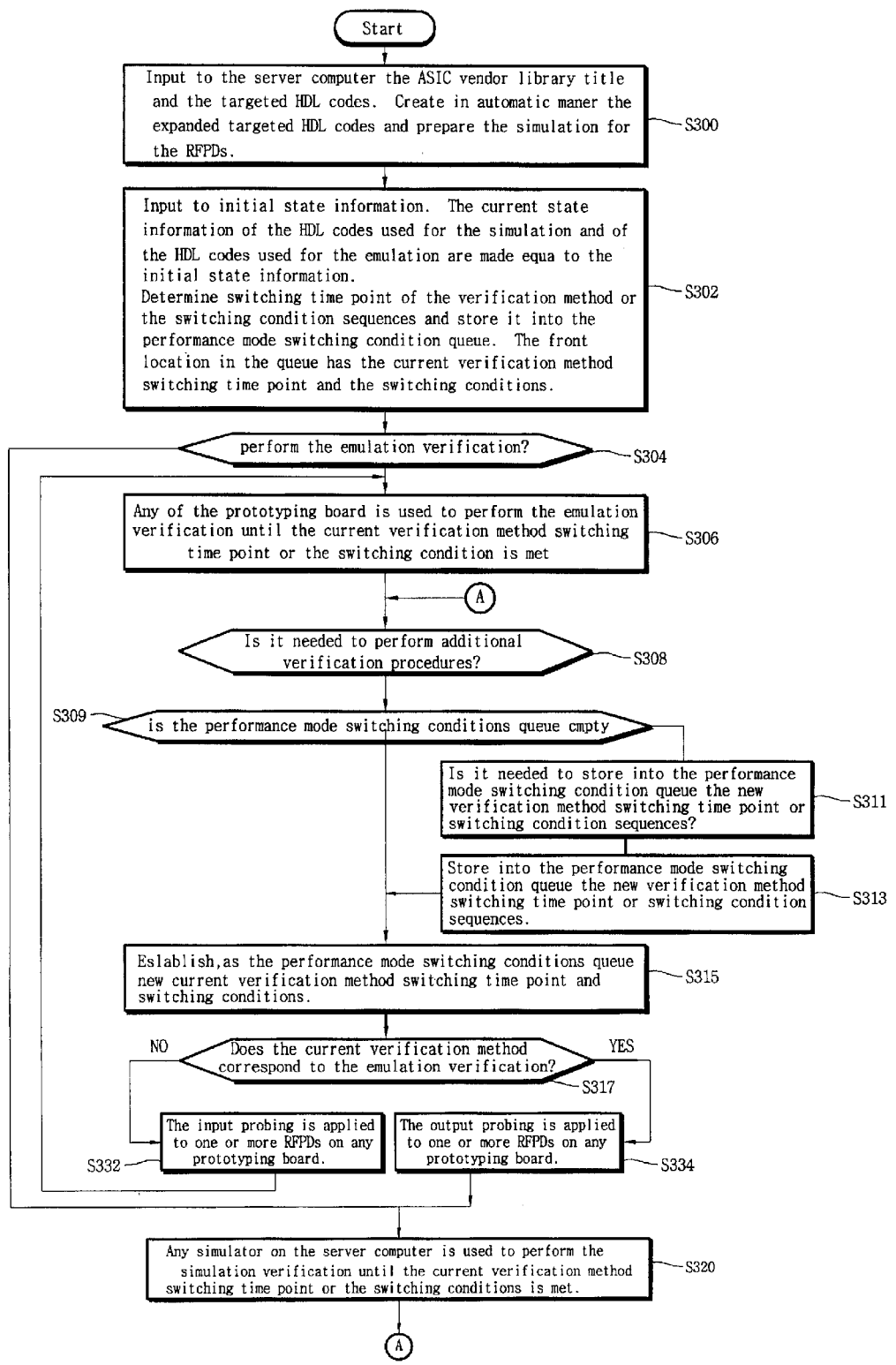
FIG. 16 is a flow chart of a design verification method according to another embodiment of the mixed emulation/simulation using FIGS. 12, 13 or 14 in accordance with the present invention.

FIG. 16 is a flow chart of the mixed simulation/emulation method by steps in accordance with another embodiment of the present invention, which is performed by the server computer 20 as illustrated in FIGS. 12, 13 and 14.

In the step S300, after a design verification target HDL code and an ASIC vendor library name used when designed are inputted by using the server computer, based on which an extended design verification target HDL code is generated by adding an IOP-probing supplementary HDL code to at least one RFPD of a prototyping board that can be subjected to input/output probing by using the input/output probing system controller in an automated manner, and the extended design verification target HDL code is implemented in the RFPD on the prototyping board, and then server computer prepares to perform simulation of the design verification target HDL code by using a simulator (S300).

In the step S302, an initial state information (values for every memory device (such as flipflops and latches) in a circuit) for the design verification target HDL code subjected to the mixed verification of emulation and simulation are inputted by using the server computer 20 so that the current state information of a simulation circuit for a simulator and of an emulation circuit for a prototyping board can be the same as the initial state information, verification method switching time pint or switching condition sequence is determined and stored in an execution mode switching condition queue, of which the forefront of the queue becomes the current verification method switching time point and switching condition (S302).

In the step S304, it is determined whether simulation is to be performed or whether emulation is to be performed with the current state information (S304).

In case that emulation is performed, it proceeds to the step S306 and performs emulation by using the prototyping board until the current verification stoppage time point or stoppage condition is met (S306).

In the step S308, it is checked whether an additional verification process is required, and if it is not required, the overall process is ended, while, if it is required, it proceeds to the step S309 (S308).

In the step S309, it is checked whether the execution mode switching condition queue is empty, and if it is not empty, it proceeds to the step S315, while, if it is empty, it proceeds to the step S311 (S309).

In the step S311, it is checked whether a new verification method switching time point or switching condition sequence is to be stored in the execution mode switching condition queue, and if it does not need to be stored, it proceeds to the step S308, while, if it needs to be stored, it proceeds to the step S313 (S311).

In the step S313, the new verification method switching time point or switching condition sequence is stored in the execution mode switching condition queue and it proceeds to the step S315 (S313).

In the step S315, the current verification method switching time point and switching condition are newly set with the execution mode switching condition queue and proceeds to the step S317 (S315).

In the step S317, it is checked whether the current verification method is emulation or simulation, and if it is emulation, it proceeds to the step S334, while, if it is simulation, it proceeds to the step S332 (S317).

In the step S332, input probing is performed for the RFPDs so that the extended design verification target HDL code implemented in the RFPD on the prototyping board has the same state information as the current state information of the design verification target HDL code at the current verification stoppage time point obtained through simulation on the server computer, and proceeds to the step S306 (S332).

In the step S334, output probing is performed for at least one RFPD on the prototyping board so that the design verification target HDL code being performed by the simulator on the server computer can have the same state information as the current state information of the design verification target HDL code at the current verification stoppage time point obtained by output probing for the extended design verification target HDL code implemented in the RFPD on the prototyping board and proceeds to the step S320 (S334).

In the step S320, simulation is performed by using the simulator until the current verification method switching time point or switching condition is met, and proceeds to the step S308 (S320).

As so far described, according to the input/output probing apparatus and the input/output probing method using the same of the present invention, the design verification target circuit emulated after being implemented in the semiconductor chips mounted on the prototyping board can be rapidly and effectively debugged. Also, since the state information is automatically exchanged with the design verification target circuit simulated by the simulator, so that a high speed functional verification and an accurate timing verification can be performed in turn, thereby performing a very effective verification.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. An input/output probing apparatus comprising:
an input/output probing system controller; and
an input/output probing interface module wherein the input/output probing system controller generates IOP-probing supplementary circuit for a design verification target circuit implemented in at least one semiconductor chip mounted on a prototyping board or an HDL code for indicating behavior of the IOP-probing supplementary circuit adds the IOP-probing supplementary circuit or the HDL code indicating the behavior of the IOP-probing supplementary circuit to the design verification target circuit or to the HDL code, so as to implement an input/output probing-feasible design verification target circuit in at least one semiconductor chip, thereby performing an input/output probing by using the IOP-probing supplementary circuit or the HDL code indicating the behavior of the IOP-probing supplementary circuit.

2. The apparatus according to claim 1, wherein the IOP-probing supplementary circuit or the HDL code indicating the behavior of the IOP-probing supplementary circuit is automatically generated by operating the input/output probing system controller.

3. The apparatus according to claim 2, wherein before the IOP-probing supplementary circuit or the HDL code indicating the behavior of the IOP-probing supplementary circuit is automatically generated by operating the input/output probing system controller, the input/output probing system controller checks the design verification target circuit or the design verification target HDL code and automatically generates a converted and new design verification target circuit or a new design verification target HDL code which is functionally equivalent to the original circuit or to the original HDL code and completely synchronized with a single clock, and performs input/output probing based on it.

4. The apparatus according to claim 2, wherein the input/output system controller additionally generates a situation detecting unit for detecting a switching condition to a probing mode for input/output probing and implements the situation detecting unit in the semiconductor chip.

5. The apparatus according to claim 2, wherein, in the output probing mode, the supplementary circuit of the extended design verification target circuit obtained by adding the IOP-probing supplementary circuit to the design verification target circuit has a shift register structure in which a parallel load is available for an output probing target memory device, of which the shift register has the logic values of the memory devices subjected to output probing by parallel loading just before shifting operation synchronized with a probing clock, to thereby perform reading for the output probing target memory, and in the input probing mode, the supplementary circuit part has a shift register structure in which a serial load is available for an input probing target memory device, and by using the shifting operation, a synchronous setting operation or a synchronous resetting operation, a synchronous setting operation or a synchronous resetting operation followed by an asynchronous setting operation or an asynchronous resetting operation and a synchronous disabling operation followed by an asynchronous setting operation or an asynchronous resetting operation are selectively adopted to each memory device subjected to input probing, to input an input probing value to the memory devices subjected to the input probing and perform a recording in the input probing target memory as required, and in a normal mode, even though the IOP-probing supplementary circuit is added to the design verification target circuit, the functional logic property of the design verification target circuit is not changed.

6. The apparatus according to claim 5, wherein, in an output probing mode, the extended design verification target circuit including the IOP-probing supplementary circuit, along with the design verification target circuit allocated in the RFPD, has at least one shift register array structure in which a parallel load is available for the output probing target memory devices in the probing target RFPD by probing target signal lines and dual-input flipflops, connects each input of the dual-input flipflop to each probing target signal line to enable each of the probing target signal lines to be parallely loaded in the dual-input flipflop, logically connects the output of a single flipflop existing in each of at least one shift register array structure to at least one output probing line of the RFPD, for an additional output probing target memory as necessary, a memory probing finite state machine included in a corresponding RPFD renders the output of a single flipflop existing in each shift register array structure which stores the content of a corresponding area read by reading operation to appear in at least one output probing line of the RFPD by shifting operation, and in an input probing mode, for the input probing target memory devices, an input of a single flipflop existing in at least one shift register array structure in which parallel load is available is logically connected to at least one input probing line of the RFPD, so as to be able to serially load the input probing value to the shift register according to the shifting operation synchronized with the probing clock, so that, in case that a system clock is connected to the clock input of each memory device in which each output of the flipflops constructing at least one parallely loadable shift register array drives each input probing target signal line, each memory device is connected to one input of each replaced dual-input memory device, or a combining circuit is added to a memory device data input terminal so that each memory device is synchronously set or reset with the output vale of each flipflop constructing at least one parallely loadable shift register array, meanwhile, for the memory devices each driving the input probing target signal lines, in case that the system clock is not physically connected with the clock input of a corresponding memory device, the corresponding memory device is constructed as a memory device having an asynchronous set input and an asynchronous reset input and a combining circuit is added to control the asynchronous set input and the asynchronous reset input of the memory device, so that the logic value of the memory device is reset as a desired input probing value through a process including an asynchronous setting operation or an asynchronous reset operation for the memory device, and for an additional input probing target memory as necessary, a logic value is applied from at least one input probing line of the RFPD to each input of the flipflop at the very first portion existing in each shift register array structure in the memory data input terminal by shifting operation, so that, after the shift register in the memory data input terminal completely performs shifting operation, the finite state machine for memory probing included in a corresponding RFPD contains the content to be written in a specific address by writing operation in a corresponding area, by which the memory probing finite state machine successively writes for a specific address in the memory, thereby performing input probing for a memory.

7. The apparatus according to claim 6, wherein the output probing line and the input probing line exist separately as an independent unidirectional probing line.

8. The apparatus according to claim 6, wherein the output probing line and the input probing line exist as mutually combined bi-directional probing line.

9. The apparatus according to claim 5, wherein the shift register array of the IOP-probing supplementary circuit is constructed by serially connecting dual-input flipflops, or is constructed the HDL code corresponding to the behavior of the shift register array of the HDL code indicating the behavior of the IOP-probing supplementary circuit as an HDL code indicating behavior of the serially connected dual-input flipflops.

10. The apparatus according to claim 5, wherein, in the probing mode, the physically same probing clock is applied to every clock input of the dual-input flipflops of the shift register array of the IOP-probing supplementary circuit, and the probing clock and the system clock are controlled by the input/output probing interface module and the input/output probing system controller.

11. The apparatus according to claim 2, wherein in case that the design verification target is expressed as the HDL code, in the output probing mode, the added HDL code part of the extended design verification target HDL code completed by adding the supplementary HDL code indicating behavior of the IOP-probing supplementary circuit to the design verification target HDL code indicates behavior of a shift register that a parallel load is available for an output probing target memory device, of which signal values of the signal lines of the register HDL code are replaced with signal values subjected to an output probing by a parallel load in the HDL code indicating the behavior of the shift register just before shifting operation synchronized with the probing clock, thereby reading a specific area of the output probing target memory, and in an input probing mode, the supplementary HDL code part has a shift register structure in which a serial load is available for an input probing target memory device, and performs a shifting operation synchronized with the probing clock, and a synchronous setting operation or a synchronous resetting operation, a synchronous setting operation or a synchronous resetting operation followed by an asynchronous setting operation or an asynchronous resetting operation and a synchronous disabling operation followed by an asynchronous setting operation or an asynchronous resetting operation is performed for signals of the HDL code indicating the behavior of the memory devices of the HDL code subjected to input probing by using the shifting operation, so that the logic values of the signals subjected to the input probing become the input probing values, to record in the input probing target memory as necessary, and in a normal mode, even though an IOP-probing supplementary circuit is added, a supplementary HDL code is constructed in a manner that it does not change the behavior of the design verification HDL code.

12. An input/output probing method in which a serially loadable shift register array for input probing for at least one flip-flop in which a system clock is not directly applied to a clock input of at least one flip-flop existing in the design verification target circuit and a locally generated clock or gated clock is inputted thereto, and an input probing supplementary circuit having a finite state machine and a controller for generating and outputting an asynchronous set/reset activation signal at a specific time point are added to a design verification target circuit, subjected to input probing, to thereby generate an extended design verification target circuit, and in an input probing mode, after input probing values are sequentially loaded from an external source to the shift register array structure through a serial loading synchronized with the probing clock, signal values controlling the asynchronous set and the asynchronous reset of the flip-flop are generated by said controller on the basis of an input probing value for the flip-flop subjected to a corresponding input probing among the input probing values loaded to each flip-flop of the shift register array, an asynchronous set/reset activation output value for the flip-flop subjected to the input probing, the output value being generated from the finite state machine, and an operation mode control value applied from an external source, from which, in the input probing mode, input probing is performed through a process including an operation of controlling the asynchronous set input and the asynchronous reset input of the flip-flop subjected to the input probing, meanwhile, in a normal operation mode, the extended design verification target circuit generated by adding the input probing supplementary circuit to the original design verification target circuit is able to perform the functionally equivalent operation with the original design verification target circuit.

13. A mixed emulation/simulation method in which an input/output probing is performed for at least one semiconductor chip by emulation for verifying by using at least one semiconductor chip which implements an extended design verification target circuit obtained by adding an IOP-probing supplementary circuit to the design verification target circuit which includes using an input/output probing interface module wherein an input/output probing system controller generates IOP-probing supplementary circuit for a design verification target circuit implemented in at least one semiconductor chip mounted on a prototyping board or an HDL code for indicating behavior of the IOP-probing supplementary circuit adds the IOP-probing supplementary circuit or the HDL code indicating the behavior of the IOP-probinq supplementary circuit to the design verification target circuit or to the HDL code, and by simulation for verifying the design verification target circuit by using a simulator, and emulation and simulation are performed in turn more than one time as necessary by exchanging state information in an automated manner between an arbitrary prototyping board and an arbitrary simulator.

14. The method according to claim 13, wherein the state information is wholly exchanged in an automated manner between an arbitrary prototyping board and an arbitrary simulator by the IOP-probing supplementary circuit-based input/output probing.

15. The method according to claim 13, wherein the state information is partially exchanged in an automated manner between an arbitrary prototyping board and an arbitrary simulator by the IOP-probing supplementary circuit-based input/output probing.

16. The apparatus according to claim 1, wherein the semiconductor chip at least one of a FPGA, a CPLD or an ASIC chip.

17. The method according to claim 13, wherein a simulation accelerator is used instead of the simulator.

18. The method according to claim 13, wherein a logic emulator or a system emulator is used instead of the prototyping board.

19. A mixed emulation/simulation method comprising the steps of:

inputting a design verification target circuit and an ASIC vendor library name used in designing by using a server computer, generating an extended design verification target circuit including an IOP-probing supplementary circuit available for input/output probing by using an input/output probing system controller in an automated manner to thereby implement the extended design verification target circuit on a prototyping board, and preparing simulation for the design verification target circuit by using an arbitrary simulator in the server computer;

inputting initial state information on the design verification target circuit subjected to the mixed verification by using the server computer so as to make the current state information on a simulation circuit for an arbitrary simulator and on an emulation circuit in an arbitrary prototyping board to be the same as the initial state information;

determining which of simulation and emulation is to be performed first;

determining an operating mode switching conditions between simulation and emulation during the process, storing the conditions in he operating mode switching condition queue on a time order, and using the forefront of the queue as a switching time point and a switching condition;

selecting either emulation or simulation suitable to the current operating mode and proceeding design verification; and discontinuing performing of the current design verification method at a time when a switching time point or a switching condition is met with the current verification method, newly setting a switching time point and switching condition of the current verification method in the operating mode switching queue, switching the current operating mode to a different operating mode, and successively performing a design verification of a design verification method different to the verification method that has been performed by far, through exchanging state information, subsequent to the former verification method, by employing the input/output probing method using the IOP-probing supplementary circuit and the input/output probing apparatus implemented in at least one semiconductor chip mounted on the arbitrary prototyping board which performs emulation, wherein emulation and simulation are performed in turn until the operating mode switching queue becomes empty.

20. A mixed emulation/simulation method comprising the steps of:

inputting a design verification target circuit and an ASIC vendor library name used in designing by using a server computer, generating an extended design verification target circuit including an IOP-probing supplementary circuit available for input/output probing by using an input/output probing system controller in an automated manner to thereby implement the extended design verification target circuit in at least one semiconductor chip mounted on a prototyping board, and preparing simulation for the design verification target circuit by using an arbitrary simulator in the server computer;

inputting initial state information on the design verification target circuit subjected to the mixed verification by using the server computer so as to make the current state information on a simulation circuit for an arbitrary simulator and on an emulation circuit in an arbitrary prototyping board to be the same as the initial state information;

determining which of simulation and emulation is to be performed first;

determining an operating mode switching conditions between simulation and emulation during the process, storing the conditions in he operating mode switching condition queue on a time order, and using the forefront of the queue as a switching time point and a switching condition;

selecting either emulation or simulation suitable to the current operating mode and proceeding design verification; and discontinuing performing of the current design verification method at a time when a switching time point or a switching condition is met with the current verification method, newly setting a switching time point and switching condition of the current verification method in the operating mode switching queue, switching the current operating mode to a different operating mode, and successively performing a design verification of a design verification method different to the verification method that has been performed by far, through exchanging state information, subsequent to the former verification method, by employing the input/output probing method using the IOP-probing supplementary circuit and the input/output probing apparatus implemented in at least one semiconductor chip mounted on the arbitrary prototyping board which performs emulation, wherein emulation and simulation are performed in turn until the operating mode switching queue becomes empty.

21. A mixed emulation/simulation method comprising the steps of:

inputting a design verification target HDL code by using a server computer, generating an extended design verification target HDL code including an IOP-probing supplementary HDL code available for input/output probing by using an input/output probing system controller in an automated manner to thereby implement the extended design verification target HDL code in at least one semiconductor chip mounted on a prototyping board, and preparing simulation for the design verification target HDL code by using an arbitrary simulator in the server computer;

inputting initial state information on the design verification target HDL code subjected to the mixed verification by using the server computer so as to make the current state information on a simulating HDL code for an arbitrary simulator and on an emulating HDL code in an arbitrary prototyping board to be the same as the initial state information;

determining which of simulation and emulation is to be performed first;

determining an operating mode switching conditions between simulation and emulation during the process, storing the conditions in he operating mode switching condition queue on a time order, and using the forefront of the queue as a switching time point and a switching condition;

selecting either emulation or simulation suitable to the current operating mode and proceeding design verification; and discontinuing performing of the current design verification method at a time when a switching time point or a switching condition is met with the current verification method, newly setting a switching time point and switching condition of the current verification method in the operating mode switching queue, switching the current operating mode to a different operating mode, and successively performing a design verification of a design verification method different to the verification method that has been performed by far, through exchanging state information, subsequent to the former verification method, by employing the input/output probing method using the IOP-probing supplementary HDL code and the input/output probing apparatus implemented in at least one semiconductor chip mounted on the arbitrary prototyping board which performs emulation, wherein emulation and simulation are performed in turn until the operating mode switching queue becomes empty.

22. An input/output probing method comprising the steps of:

inputting an ASIC vendor library name and design verification target circuit or a design verification target HDL code;

inputting an input/output probing target signal line; generating an IOP-probing supplementary circuit by corresponding semiconductor chips mounted on a prototyping board, and adding the generated circuit to a design verification target circuit to thereby generate an extended design verification target circuit, or generating an IOP-probing supplementary HDL code, and adding it to a design verification target HDL code to thereby generated an extended design verification target HDL code;

implementing the extended design verification target circuit or the extended design verification target HDL code in a corresponding semiconductor chip on the prototyping board;

performing a circuit verification process in a normal mode;

inspecting whether probing is necessary and whether it is an output probing;

generating an input probing data by a server computer, switching to an input probing mode, applying the input probing data to the input probing line through an input/output probing interface module by the server computer, and performing input probing; and switching to an output probing mode, performing output probing, transferring the value obtained in an output probing line to the server computer through the input/output probing interface module, to complete output probing.

23. The method according to claim 22, wherein the input/output probing system controller for performing input/output probing in the prototyping board connected with the input/output probing interface module, the input/output probing server computer and the simulation server computer performing the simulator are connected, or the input/output probing system controller for performing input/output probing in the prototyping board connected with the input/output probing interface module, an input/output probing server computer and the simulation accelerator server computer are connected through a local or remote area computer network or through an inter-network, so that emulation and simulation are performed in a remote manner in a dispersed network environment on the basis of the input/output probing method using the input/output probing apparatus.

24. The Internet-based semiconductor design verifying and inspecting method according to claim 23, wherein the mixed emulation and simulation service performed in a remote manner in the dispersed network environment is provided on the Internet.

25. The method according to claim 24, wherein the mixed emulation and simulation service performed in a remote manner in the dispersed network environment is provided on the Internet on the basis of the input/output probing method using the IOP-probing supplementary circuit.

* * * * *